(12) United States Patent
Hatakeyama et al.

(10) Patent No.: US 10,914,586 B2
(45) Date of Patent: Feb. 9, 2021

(54) VIBRATION APPARATUS

(71) Applicant: KABUSHIKI KAISHA TOSHIBA, Minato-ku (JP)

(72) Inventors: Yohei Hatakeyama, Yokohama (JP); Tetsuro Itakura, Nerima (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 267 days.

(21) Appl. No.: 16/119,696

(22) Filed: Aug. 31, 2018

(65) Prior Publication Data
US 2019/0265035 A1 Aug. 29, 2019

(30) Foreign Application Priority Data
Feb. 28, 2018 (JP) .................................. 2018-035637

(51) Int. Cl.
*G01C 19/5733* (2012.01)
*B81B 3/00* (2006.01)

(52) U.S. Cl.
CPC ........ *G01C 19/5733* (2013.01); *B81B 3/0051* (2013.01); *B81B 2201/0242* (2013.01); *B81B 2207/03* (2013.01)

(58) Field of Classification Search
CPC ............ G01C 19/5733; G01C 19/5747; G01C 19/5762; G01C 19/5726; G01C 19/574; B81B 3/0051; B81B 2207/03; B81B 2201/0242

See application file for complete search history.

(56) References Cited

U.S. PATENT DOCUMENTS

| | | | |
|---|---|---|---|
| 2003/0061878 A1 | 4/2003 | Pinson | |
| 2008/0148846 A1 | 6/2008 | Whelan et al. | |
| 2009/0107238 A1 | 4/2009 | Guo | |
| 2011/0041608 A1 | 2/2011 | Wilner et al. | |

(Continued)

FOREIGN PATENT DOCUMENTS

| | | |
|---|---|---|
| JP | 2005-504273 | 2/2005 |
| JP | 2009-109494 | 5/2009 |
| JP | 2013-501941 | 1/2013 |

(Continued)

OTHER PUBLICATIONS

Ryunosuke Gando, et al., "An Intermittent Free-Vibration MEMS Gyroscope Enabled by Catch-and-Release Mechanism for Low-Power and Fast-Startup Applications", 2017 IEEE 30th International Conference on Micro Electro Mechanical Systems (MEMS), Jan. 22-26, 2017, pp. 29-32.

*Primary Examiner* — Suman K Nath
(74) *Attorney, Agent, or Firm* — Oblon, McClelland, Maier & Neustadt, L.L.P.

(57) ABSTRACT

According to one embodiment, a vibration apparatus includes a coupled vibration mechanism which includes a plurality of mass parts and connects the mass parts, a catch and release mechanism which catches a vibrating mass parts to stop vibration and releases a caught mass parts to start vibration and a control circuitry configured to determine whether catching the mass parts by the catch and release mechanism is successful or failed and control the catch and release mechanism for raising possibility for catching the mass parts by the catch and release mechanism, if the catching the mass parts is determined as failed.

11 Claims, 9 Drawing Sheets

(56) References Cited

U.S. PATENT DOCUMENTS

2016/0003865 A1* 1/2016 Brisson ................ G01P 15/131
　　　　　　　　　　　　　　　　　　　73/514.36
2018/0164100 A1　6/2018 Hataketama et al.

FOREIGN PATENT DOCUMENTS

| JP | 5389664 B2 | 1/2014 |
|---|---|---|
| JP | 2018-96711 | 6/2018 |

* cited by examiner

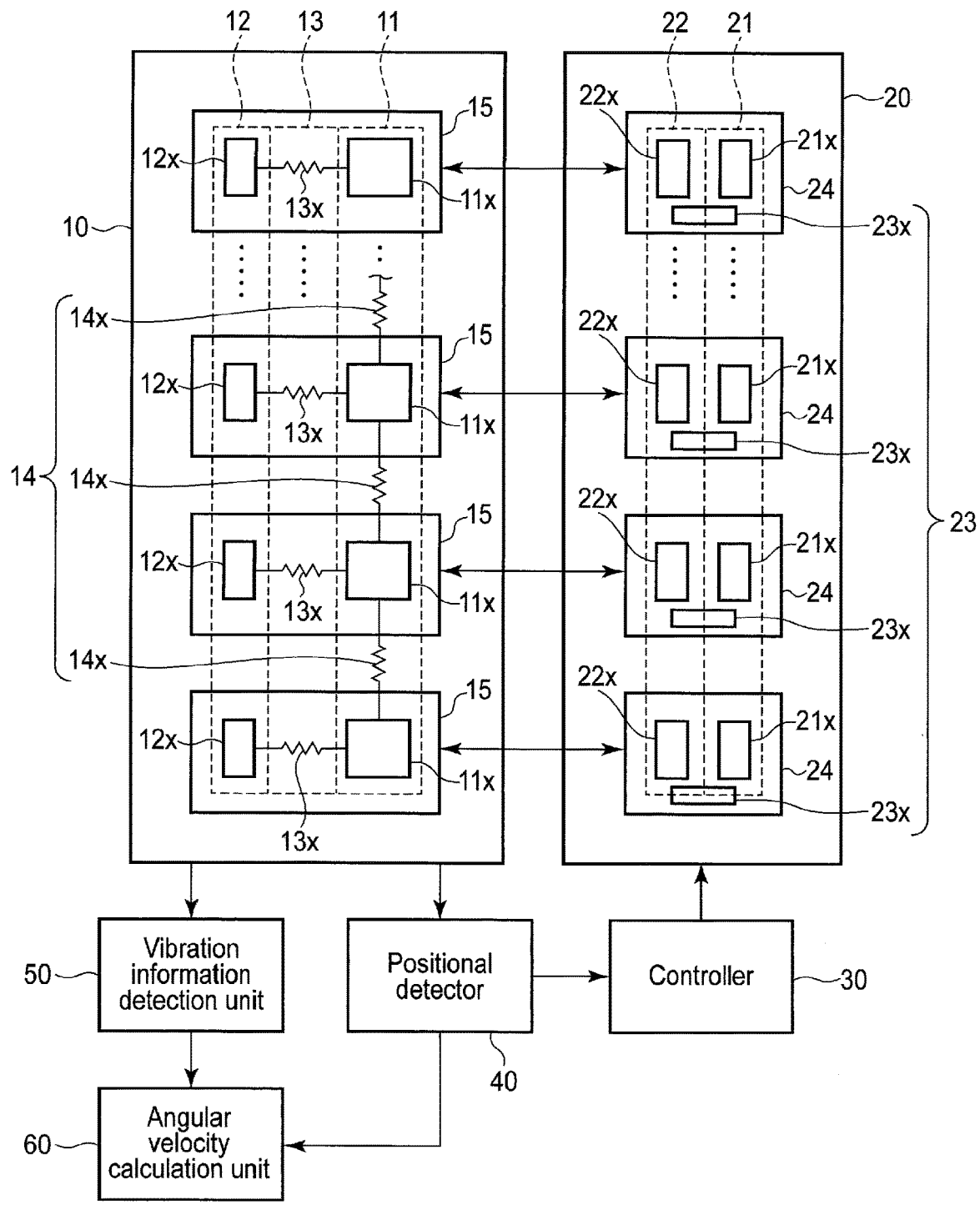
F I G. 1

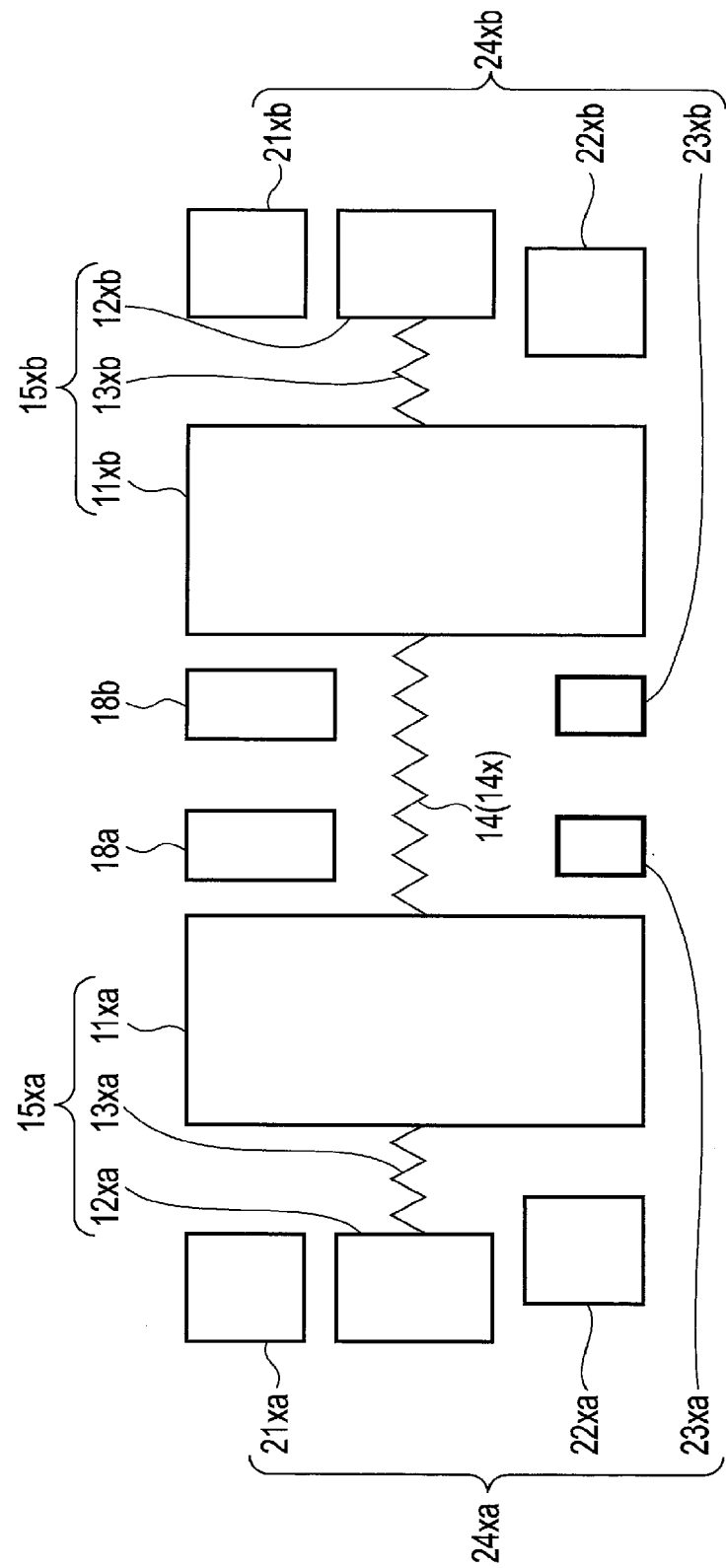
F I G. 2

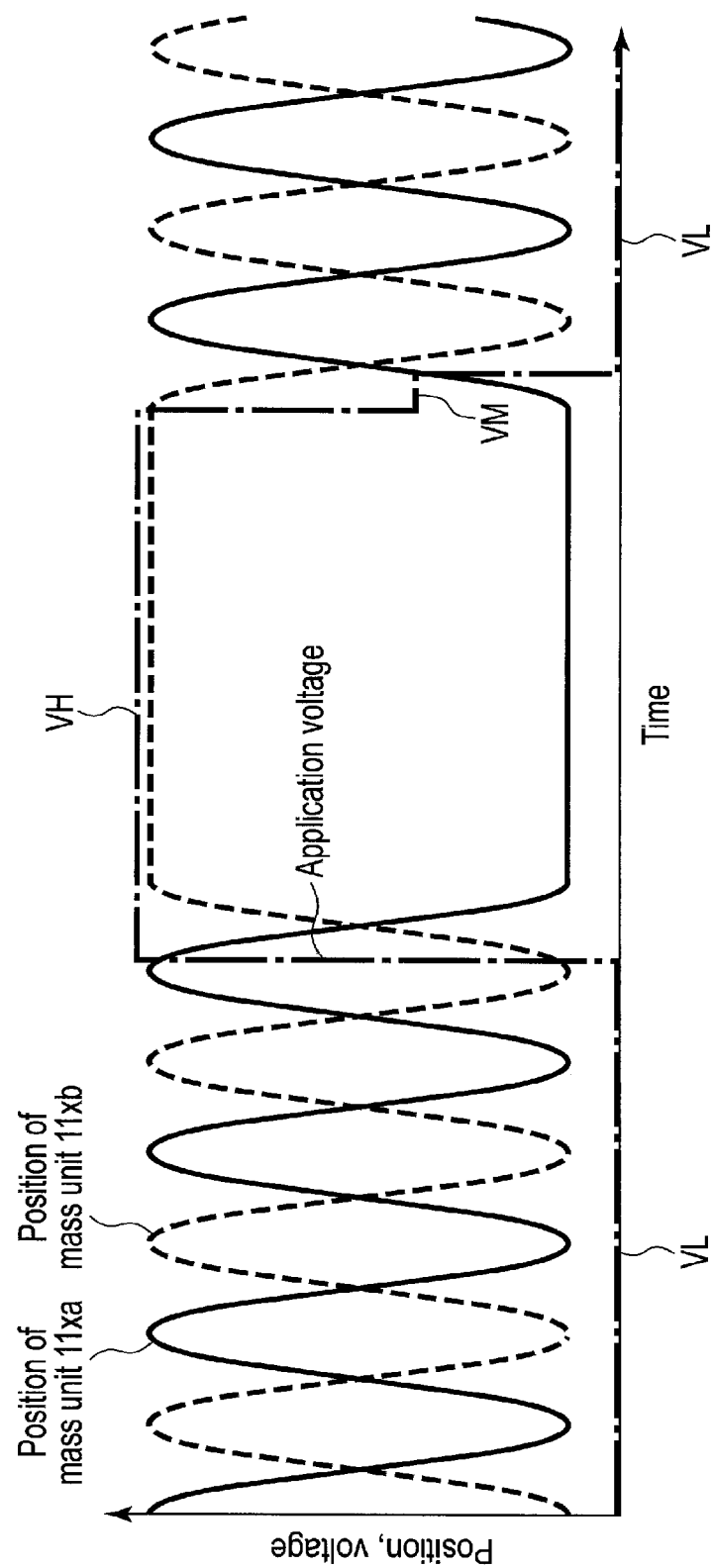
F I G. 4

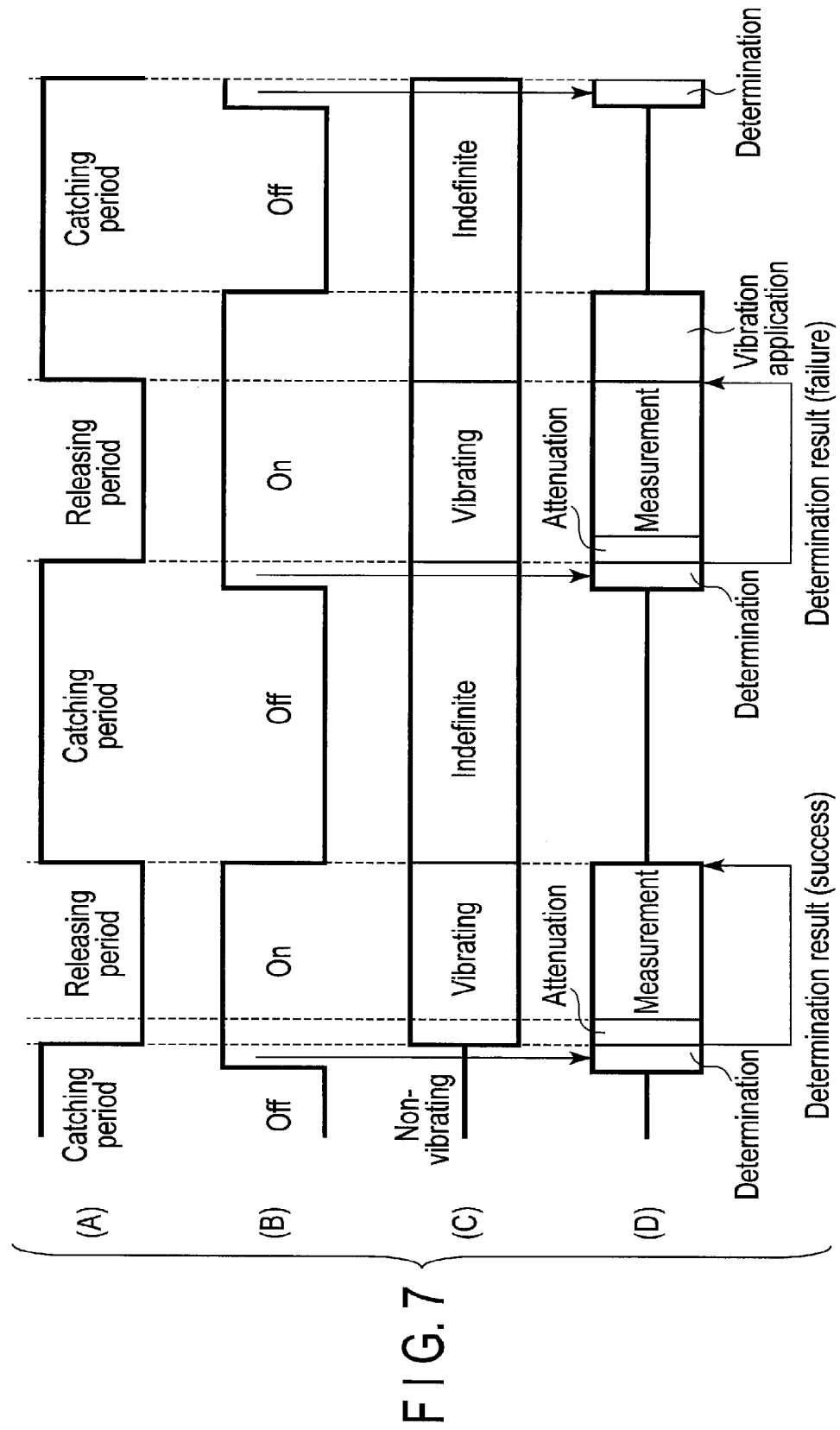
F I G. 7

US 10,914,586 B2

VIBRATION APPARATUS

CROSS-REFERENCE TO RELATED APPLICATIONS

This application is based upon and claims the benefit of priority from Japanese Patent Application No. 2018-035637, filed Feb. 28, 2018, the entire contents of which are incorporated herein by reference.

FIELD

Embodiments described herein relate generally to a vibration apparatus.

BACKGROUND

In a coupled vibrator in which a plurality of mass parts are connected, a coupled vibrator in which the mass parts are vibrated by catching and releasing the mass parts is developed.

However, conventionally, an appropriate catching and releasing operation is not always performed.

BRIEF DESCRIPTION OF THE DRAWINGS

FIG. 1 is a diagram illustrating a conceptual configuration of a vibration apparatus according to an embodiment;

FIG. 2 is a diagram schematically illustrating a first specific configuration example of the vibration apparatus according to the embodiment;

FIG. 4 is a timing chart illustrating a vibration control method of the vibration apparatus according to the embodiment;

FIG. 7 is a second specific sequence diagram illustrating a releasing operation and catching operation according to the embodiment;

DETAILED DESCRIPTION

Figure 3:
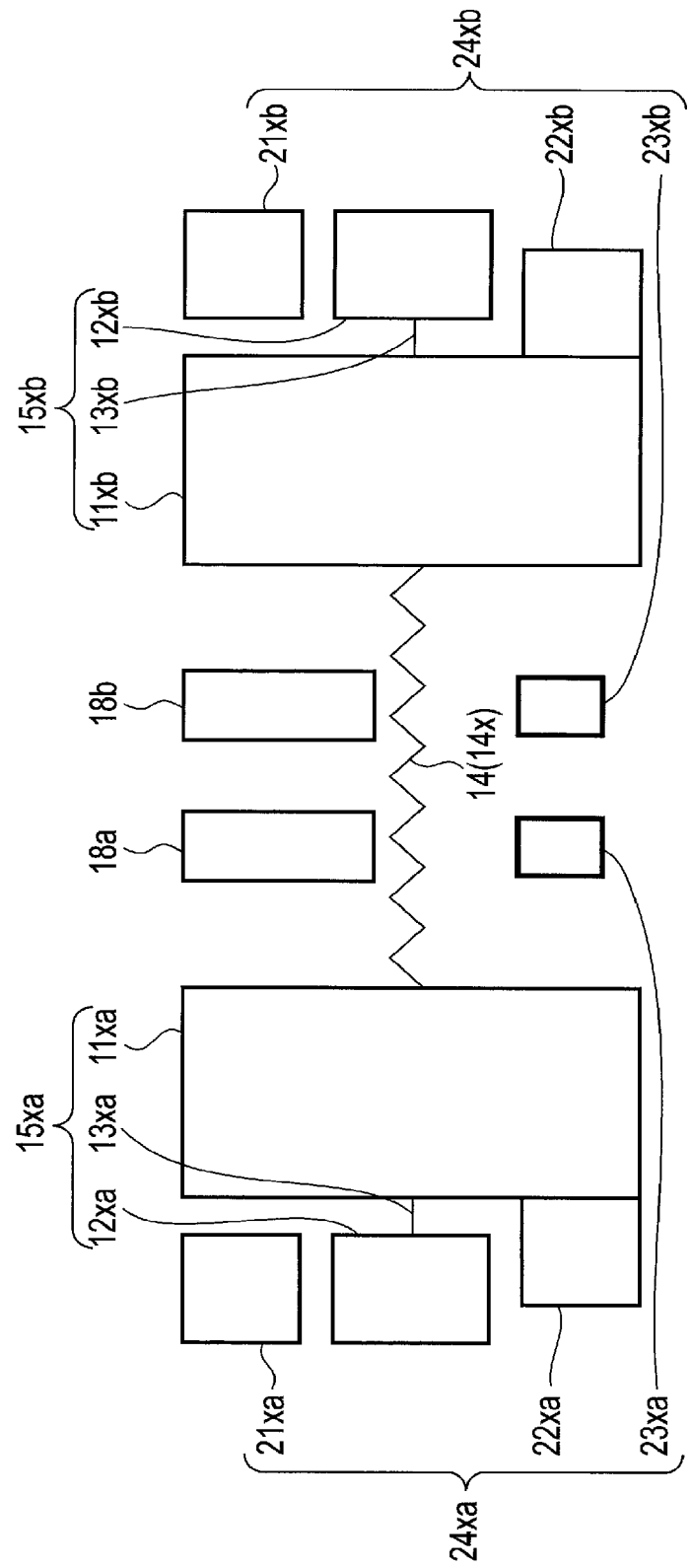
FIG. 3 is a diagram schematically illustrating a state in which mass parts are caught by electrode/stopper units, respectively in the first specific configuration example of the vibration apparatus according to the embodiment.

In general, according to one embodiment, a vibration apparatus includes a coupled vibration mechanism which includes a plurality of mass parts and connects the mass parts, a catch and release mechanism which catches a vibrating mass parts to stop vibration and releases a caught mass parts to start vibration, and a control circuitry configured to determine whether catching the mass parts by the catch and release mechanism is successful or failed and control the catch and release mechanism for raising possibility for catching the mass parts by the catch and release mechanism, if the catching the mass parts is determined as failed.

Hereinbelow, embodiments will be described with reference to the drawings.

FIG. 1 is a diagram illustrating a conceptual configuration of a vibration apparatus according to an embodiment. The vibration apparatus according to the present embodiment is formed on a semiconductor substrate with use of a MEMS (micro-electromechanical systems) technique and is used as a gyro sensor (angular velocity detection device).

The vibration apparatus illustrated in FIG. 1 includes a coupled vibration mechanism 10, a catch and release mechanism 20, a controller 30 (a control circuitry, a control unit), a positional detector 40 (position detection unit), a vibration information detection unit 50 (vibration information detection circuitry), and an angular velocity calculation unit 60 (angular velocity calculation circuitry).

The coupled vibration mechanism 10 includes a mass unit 11, a fixed unit 12, a connection unit (second connection unit) 13, and a connection unit (first connection unit) 14.

The mass unit 11 includes a plurality of mass parts 11x. These mass parts 11x constitute mass of the coupled vibration mechanism 10. Vibration of the mass parts 11x causes vibration of the coupled vibration mechanism 10 to be executed.

The fixed unit 12 includes a plurality of fixed parts (fixed ends) 12x provided to correspond to the plurality of mass parts 11x. These fixed parts 12x are fixed on a substrate.

The connection unit (second connection unit) 13 is configured to connect the plurality of mass parts 11x to the plurality of fixed parts 12x. The connection unit 13 includes a plurality of connection spring parts 13x provided to correspond to the plurality of mass parts 11x. One end of each connection spring part 13x is connected to the corresponding mass part 11x while the other end thereof is connected to the corresponding fixed part 12x. Accordingly, the connection spring part 13x expands and contracts in response to the vibration of the mass part 11x.

The connection unit (first connection unit) 14 is configured to connect the plurality of mass parts 11x to each other. In the example illustrated in FIG. 1, the connection unit 14 includes a plurality of connection members 14x. By providing the connection unit 14, the vibration of each mass part 11x is restricted by other mass parts 11x. Each of the connection members 14x may be made of an elastic member such as a spring or a non-elastic member (a member whose length does not change).

A vibrator unit 15 is configured by the aforementioned mass part 11x, fixed part 12x, and connection spring part 13x, and the coupled vibration mechanism 10 is configured by a plurality of vibrator units 15.

The catch and release mechanism 20 is configured to catch a vibrating mass unit 11 to stop vibration and release a caught mass unit 11 to start vibration. The catch and release mechanism 20 includes an electrode unit 21 to which a voltage for catching the mass unit 11 is applied, a stopper unit 22 preventing the mass unit 11 from contacting the electrode unit 21 when the mass unit 11 is caught, and a vibration application unit 23 (vibration source) applying a vibration to the mass unit 11.

The electrode unit 21 includes a plurality of catch electrode parts 21x provided to correspond to the plurality of mass parts 11x. The catch electrode parts 21x are electrodes to which a voltage for catching the mass parts 11x is applied. The stopper unit 22 includes a plurality of stopper parts 22x provided to correspond to the plurality of mass parts 11x.

When a predetermined voltage is applied between the mass part $11x$ and the catch electrode part $21x$, the mass part $11x$ approaches the catch electrode part $21x$ due to an electrostatic attractive force. At this time, the stopper part $22x$ prevents the mass part $11x$ from contacting the catch electrode part $21x$. The vibration application unit 23 includes a plurality of vibration application electrode parts $23x$ provided to correspond to the plurality of mass parts $11x$. When a predetermined voltage is applied between the mass part $11x$ and the vibration application electrode part $23x$ while the mass part $11x$ is vibrating, vibration is applied to the mass part $11x$ due to the electrostatic attractive force. That is, an amplitude of the mass part $11x$ increases.

An electrode/stopper unit 24 is configured by the aforementioned catch electrode part $21x$, stopper part $22x$, and vibration application electrode part $23x$, the catch and release mechanism 20 is configured by the plurality of electrode/stopper units 24.

Meanwhile, the vibration application electrode parts $23x$ constituting the vibration application unit 23 are electrodes for applying a vibration. However, each of the vibration application electrode parts $23x$ does not have to be an electrode as long as the vibration application unit 23 can apply a vibration to the mass unit 11. In the following description, the vibration application unit 23 is constituted by the plurality of vibration application electrode parts $23x$ (electrodes for applying a vibration) as illustrated in FIG. 1.

The controller 30 is configured to control catching or releasing the mass unit 11 (mass parts $11x$) of the catch and release mechanism 20 by applying a voltage between the mass unit 11 (mass parts $11x$) and the electrode unit 21 (catch electrode parts $21x$). Specifically, the controller 30 performs catching and releasing the mass unit 11 by applying a control voltage to the electrode unit 21. Details of operations of the controller 30 will be described below. The controller 30 also controls start/stop of operations of the below-mentioned positional detector 40, vibration information detection unit 50, and angular velocity calculation unit 60.

The positional detector 40 (positional detector) is configured to detect a position of the mass unit 11 (positions of the mass parts $11x$). In other words, the positional detector 40 is configured to detect a vibration state of the mass unit 11 (vibration states of the mass parts $11x$). The positional detector 40 detects a predetermined physical quantity which varies in accordance with the vibration of the mass unit 11. Examples of the predetermined physical quantity are a physical quantity based on electrostatic capacitance, a physical quantity based on resistance, and a physical quantity based on a piezoelectric effect. The physical quantity based on the electrostatic capacitance is detected by a variable capacitance element, the physical quantity based on resistance is detected by a variable resistance element, and the physical quantity based on a piezoelectric effect is detected by a piezoelectric element. The controller 30 applies the voltage for catching the mass unit 11 between the mass unit 11 and the electrode unit 21 based on the position (the vibration state) of the mass unit 11 detected by the positional detector 40. That is, the positional detector 40 detects the position of the mass unit 11 while the mass unit 11 is vibrating, and the controller 30 applies the control voltage to the electrode unit 21 so that the mass unit 11 is caught at an optimal timing. The vibration information detection unit 50 is configured to detect vibration information of the mass unit 11. Specifically, the vibration information detection unit 50 detects a predetermined physical quantity which varies in accordance with the vibration of the mass unit 11 in a similar manner to the vibration information detection unit 50 detects the vibration information of the mass unit 11 based on a Coriolis force acting on the mass unit 11 by a variable capacitance element. Specifically, when a rotational movement is added to the mass unit 11 while the mass unit 11 is vibrating, the Coriolis force acts on the mass unit 11.

The vibration information detection unit 50 detects the vibration information of the mass unit 11 based on the Coriolis force from a variation in the electrostatic capacitance of the variable capacitance element.

The angular velocity calculation unit 60 is configured to calculate angular velocity of the mass unit 11 based on the vibration information detected by the vibration information detection unit 50. That is, the angular velocity can be obtained by demodulating the vibration information of the mass unit 11 based on the Coriolis force, which is a modulation signal of angular velocity. When the vibration information of the mass unit 11 based on the Coriolis force is detected by the vibration information detection unit 50, the angular velocity of the mass unit 11 can be calculated by the angular velocity calculation unit 60.

Meanwhile, a direction in which the mass unit 11 vibrates as the mass unit 11 is released by the catch and release mechanism 20 is referred to as a drive direction. Also, a direction of vibration based on the Coriolis force acting on the mass unit 11 is referred to as a sense direction. Here, the drive direction and the sense direction are perpendicular to each other.

FIG. 2 is a diagram schematically illustrating a first specific configuration example of the vibration apparatus according to the embodiment. The basic concept is similar to that of the vibration apparatus illustrated in FIG. 1.

In the vibration apparatus illustrated in FIG. 2, the coupled vibration mechanism includes two vibrator units $15xa$ and $15xb$, and the catch and release mechanism includes two electrode/stopper units $24xa$ and $24xb$.

The vibrator unit $15xa$ includes a mass part $11xa$, a secured part $12xa$, and a connection spring part $13xa$. Similarly, the vibrator unit $15xb$ includes a mass part $11xb$, a secured part $12xb$, and a connection spring part $13xb$.

The electrode/stopper unit $24xa$ includes a catch electrode part $21xa$, a stopper part $22xa$, and a vibration application electrode part $23xa$. Similarly, the electrode/stopper unit $24xb$ includes a catch electrode part $21xb$, a stopper part $22xb$, and a vibration application electrode part $23xb$.

The mass part (first mass part) $11xa$ and the mass part (second mass part) $11xb$ are arranged in a direction parallel to a vibration direction (first direction) and are connected via the connection unit 14. In the present embodiment, the connection unit 14 includes a single connection member $14x$.

An electrode part $18a$ is provided near the mass part $11xa$, and the mass part $11xa$ and the electrode part $18a$ constitute a first variable capacitor. Similarly, an electrode part $18b$ is provided near the mass part $11xb$, and the mass part $11xb$ and the electrode part $18b$ constitute a second variable capacitor. As the mass parts $11xa$ and $11xb$ vibrate, a distance between the mass part $11xa$ and the electrode part $18a$ and a distance between the mass part $11xb$ and the electrode part $18b$ vary. As a result, capacitance of the first variable capacitor and capacitance of the second variable capacitor vary. Based on the capacitance variations, the vibration information is detected by the vibration information detection unit 50 in FIG. 1.

The mass part $11xa$ and the mass part $11xb$ vibrate in anti-phase. That is, when the mass part $11xa$ moves far from the secured part $12xa$, the mass part $11xb$ also moves far from the secured part 12xb. Conversely, when the mass part 11xa approaches the secured part 12xa, the mass part 11xb also approaches the secured part 12xb. In this manner, since the mass part 11xa and the mass part 11xb vibrate in anti-phase, an influence of translational movement such as acceleration can be eliminated, and rotational movement can be extracted appropriately.

FIG. 3 is a diagram schematically illustrating a state in which the mass part 11xa is caught by the electrode/stopper unit 24xa and the mass part 11xb is caught by the electrode/stopper unit 24xb.

When the predetermined voltage is applied to the catch electrode parts 21xa and 21xb, the electrostatic attractive force acts between the catch electrode part 21xa and the mass part 11xa and between the catch electrode part 21xb and the mass part 11xb. At this time, due to the stopper parts 22xa and 22xb, contact between the catch electrode part 21xa and the mass part 11xa and contact between the catch electrode part 21xb and the mass part 11xb can be avoided. That is, a distance between the stopper part 22xa and the mass part 11xa is shorter than a distance between the catch electrode part 21xa and the mass part 11xa. Similarly, a distance between the stopper part 22xb and the mass part 11xb is shorter than a distance between the catch electrode part 21xb and the mass part 11xb. Accordingly, the contact between the catch electrode part 21xa and the mass part 11xa and the contact between the catch electrode part 21xb and the mass part 11xb can be avoided.

Timing at which the mass parts 11xa and 11xb are caught by the electrode/stopper units 24xa and 24xb is determined by the controller 30 and the positional detector 40 illustrated in FIG. 1. Specifically, a state in which the mass parts 11xa and 11xb approach the secured parts 12xa and 12xb most closely, respectively, is detected by the positional detector 40, and based on the detection result of the positional detector 40, the predetermined voltage is applied from the controller 30 to the catch electrode parts 21xa and 21xb. Thus, the mass parts 11xa and 11xb are caught by the electrode/stopper units 24xa and 24xb, respectively.

Next, timing at which the mass parts 11xa and 11xb are released from the electrode/stopper units 24xa and 24xb will be described.

As illustrated in FIG. 3, before the mass parts 11xa and 11xb start vibration, the mass part 11xa is caught by the electrode/stopper unit 24xa, and the mass part 11xb is caught by the electrode/stopper unit 24xb. In this state, by changing the voltage to be applied to the catch electrode parts 21xa and 21xb, the mass parts 11xa and 11xb can be released from the electrode/stopper units 24xa and 24xb, respectively, and the mass parts 11xa and 11xb start vibration. The details thereof will be described below.

As described above, in the vibration apparatus according to the present embodiment, since the mass part 11xa and the mass part 11xb vibrate in anti-phase, an influence of translational movement such as acceleration can be eliminated, and rotational movement can be extracted appropriately. However, when the mass parts 11xa and 11xb, which are in a state of being caught by the electrode/stopper units 24xa and 24xb, are released and start vibration, a vibration component in an in-phase mode is also generated due to a difference in resonant frequency between the mass part 11xa and the mass part 11xb and a difference in a release timing between the mass part 11xa and the mass part 11xb. As a result, vibration in the anti-phase mode and vibration in the in-phase mode are superposed, and a beat is generated. When the beat is generated, an amplitude of vibration of each of the mass parts 11xa and 11xb goes beyond an allowable range, and the mass parts 11xa and 11xb may contact the stopper parts 22xa and 22xb during the vibration, respectively. As a result, the vibration of the mass parts 11xa and 11xb is adversely influenced, and the detection operation is not able to be performed with accuracy.

In the present embodiment, to solve the above problem, a method described below is employed.

FIG. 4 is a timing chart illustrating a vibration controlling method of the vibration apparatus according to the present embodiment. The horizontal axis represents time. The vertical axis represents respective positions of the mass parts 11xa and 11xb and the voltage applied to the catch electrode parts 21xa and 21xb (the voltage applied between the catch electrode part 21xa and the mass part 11xa and the voltage applied between the catch electrode part 21xb and the mass part 11xb).

As illustrated in FIG. 4, in the present embodiment, when the mass part 11xa and the mass part 11xb are released from the electrode/stopper unit 24xa and the electrode/stopper unit 24xb, which are catching the mass part 11xa and the mass part 11xb, respectively, the voltage does not directly change from a holding voltage VH to a release voltage VL, but a period for applying a intermediate voltage VM is provided between a period for applying the holding voltage VH and a period for applying the release voltage VL. In the present embodiment, the intermediate voltage VM is smaller than the holding voltage VH and greater than the release voltage VL.

As illustrated in FIG. 4, in a case in which the intermediate voltage VM is applied immediately after a release timing of the mass unit 11, the vibration energy of each mass part is lowered, and the amplitude of the mass part can be lowered. In consideration of such a role of the intermediate voltage VM, The timing of applying the intermediate voltage VM is not necessary to be immediately after the release timing of the mass unit 11.

Also, in FIG. 4, the intermediate voltage VM is set to be smaller than the holding voltage VH and greater than the release voltage VL. However, In consideration of the aforementioned role of the intermediate voltage VM, the intermediate voltage VM has only to be greater than the release voltage VL and is not necessary to be smaller than the holding voltage VH. In other words, the intermediate voltage VM is not necessary to be between the release voltage VL and the holding voltage VH.

Based on the above, in general, the controller 30 is configured to apply, between the mass unit 11 (mass parts 11x) and the electrode unit 21 (catch electrode parts 21x), a voltage greater than a steady voltage applied between the mass unit 11 (mass parts 11x) and the electrode unit 21 (catch electrode parts 21x) at least a part of a period from time when the mass unit (mass parts 11x) are released from the catch and release mechanism 20 to time when the steady voltage is applied between the mass unit 11 (mass parts 11x) and the electrode unit 21 (catch electrode parts 21x). To be more precise, the controller 30 may apply between the mass unit 11 (mass parts 11x) and the electrode unit 21 (catch electrode parts 21x), a voltage greater than a steady voltage applied between the mass unit 11 (mass parts 11x) and the electrode unit 21 (catch electrode parts 21x) at least a part of a period after the mass unit 11 (mass parts 11x) are released from the catch and release mechanism 20 and before the steady voltage is applied between the mass unit 11 (mass parts 11x) and the electrode unit 21 (catch electrode parts 21x). The steady voltage is a voltage steadily applied between the mass unit 11 (mass parts 11x) and the electrode unit 21 (catch electrode parts 21x) while the mass unit 11

(mass parts 11x) is vibrating. The steady voltage is normally a voltage finally applied between the mass unit 11 and the electrode unit 21 while the mass unit 11 is vibrating. In the example illustrated in FIG. 4, the release voltage VL corresponds to the steady voltage. The steady voltage is 0 (volts), for example.

In this manner, by providing the period for applying the intermediate voltage VM, the vibration energy of each of the mass parts 11xa and 11xb at the time of the release can be lowered. Hereinbelow, an operation for applying the intermediate voltage VM is referred to as an attenuation vibration operation. Accordingly, the amplitude (in particular, amplitude in the anti-phase mode) of vibration of each of the mass parts 11xa and 11xb can be lowered, and an amplitude caused by the beat can also be lowered. Consequently, the mass parts 11xa and 11xb can be prevented from contacting the stopper parts 22xa and 22xb during the vibrations, and the detection operations are able to be performed with accuracy.

However, in a case in which the amplitude of vibration of the mass part 11xa is lowered in the above method, the distance between the mass part 11xa and the catch electrode part 21xa becomes longer, and a condition for catching the mass part 11xa by the electrode/stopper unit 24xa (catch condition) may not be satisfied. The catch condition is expressed by the following equation.

$$kx < \alpha V^2 / (A-x) \quad (1)$$

In this equation, k is a spring constant of the connection spring part 13xa, x is an amplitude value of the mass part 11xa, α is a structural coefficient caused by the structures of the catch electrode part 21xa and the mass part 11xa, A is an inter-electrode distance (position of the catch electrode part 21xa), and V is a voltage applied between the mass part 11xa and the catch electrode part 21xa at the time of a catching operation. Here, the amplitude value x satisfies 0≤x<B<A. B is a stopper distance (position of the stopper part 22xa). Meanwhile, the catching operation refers to catching the mass unit 11 (mass parts 11x) by the catch and release mechanism 20. In other words, the catching operation refers to an operation in which the controller 30 applies the voltage for catching the mass part 11xa (mass unit 11) between the mass part 11xa (mass unit 11) and the catch electrode part 21xa (electrode/stopper unit 24). Also, as described below, a releasing operation refers to releasing the mass unit 11 (mass parts 11x) by the catch and release mechanism 20. In other words, the releasing operation refers to an operation in which, in a state in which the holding voltage VH is applied between the mass part 11xa (mass unit 11) and the catch electrode part 21xa (electrode/stopper unit 24), the controller 30 switches the apply voltage into a smaller voltage than the holding voltage VH.

In a case in which the electrostatic attractive force acting on the mass part 11xa (right-hand side in Equation (1)) is greater than the restoring force acting on the mass part 11xa (left-hand side in Equation (1)) in a state in which the mass part 11xa approaches the catch electrode part 21xa most closely, the electrode/stopper unit 24xa can catch the mass part 11xa. On the other hand, in a case in which the restoring force acting on the mass part 11xa (left-hand side in Equation (1)) is greater than the electrostatic attractive force acting on the mass part 11xa (right-hand side in Equation (1)), the electrode/stopper unit 24xa cannot catch the mass part 11xa. The same is true of the operation of catching the mass part 11xb by the electrode/stopper unit 24xb.

Under such circumstances, in the present embodiment, the controller 30 performs the following control so as for the catch and release mechanism 20 (the electrode/stopper units 24xa and 24xb) to release the mass unit 11 (the mass part 11xa and the mass part 11xb) and then catch the mass unit 11 (the mass part 11xa and the mass part 11xb).

The controller 30 determines whether catching the mass parts 11xa and 11xb by the electrode/stopper units 24xa and 24xb is successful or failed. And the controller 30 controls the electrode/stopper units 24xa and 24xb for raising possibility for catching the mass parts 11xa and 11xb by the electrode/stopper units 24xa and 24xb, if the catching the mass parts 11xa and 11xb is determined as failed. The controller 30 determines whether catching the mass unit 11 (the mass parts 11xa and 11xb) by the catch and release mechanism 20 (the electrode/stopper units 24xa and 24xb) is successful or failed based on a vibration state of the mass unit 11 (vibration states of the mass parts 11xa and 11xb). As described below, a catch determination refers to determining whether catching the mass unit 11 by the catch and release mechanism 20 is successful or failed. And a catch control refers to controlling the catch and release mechanism 20 for raising possibility for catching the mass unit 11 by the catch and release mechanism 20.

As the catch control for raising catch possibility (catch probability), the following methods are provided, for example.

(1) The controller 30 applies, between the mass unit 11 and the electrode unit 21, a voltage greater than a voltage which has been applied between the mass unit 11 and the electrode unit 21, if catching the mass unit 11 is determined as failed. Thus, the electrostatic attractive forces acting between the electrode/stopper unit 24xa and the mass part 11xa and between the electrode/stopper unit 24xb and the mass part 11xb increase. Consequently, the possibility for catching the mass part 11xa and the mass part 11xb by the electrode/stopper units 24xa and 24xb, respectively (catch probability), is raised.

(2) The vibration application unit 23 applies the vibration to the mass unit 11. Specifically, a voltage synchronized with the vibration of the mass part 11xa is applied between the vibration application electrode part 23xa and the mass part 11xa by the controller 30. Also, a voltage synchronized with vibration of the mass part 11xb is applied between the vibration application electrode part 23xb and the mass part 11xb by the controller 30. As a result, the amplitudes of the mass part 11xa and the mass part 11xb increase in response to the electrostatic attractive forces resulting from the voltage application. Thus, the distance between the mass part 11xa and the catch electrode part 21xa in the state in which the mass part 11xa approaches the catch electrode part 21xa most closely and the distance between the mass part 11xb and the catch electrode part 21xb in a state in which the mass part 11xb approaches the catch electrode part 21xb most closely are shortened. Thus, the electrostatic attractive forces acting between the electrode/stopper unit 24xa and the mass part 11xa and between the electrode/stopper unit 24xb and the mass part 11xb become greater. Consequently, the possibility for catching the mass part 11xa and the mass part 11xb by the electrode/stopper units 24xa and 24xb, respectively (catch probability), is raised.

A configuration of the vibration apparatus for achieving operations of raising the aforementioned catch possibility (catch probability) and catching the mass unit 11 will be described below.

Figure 5:
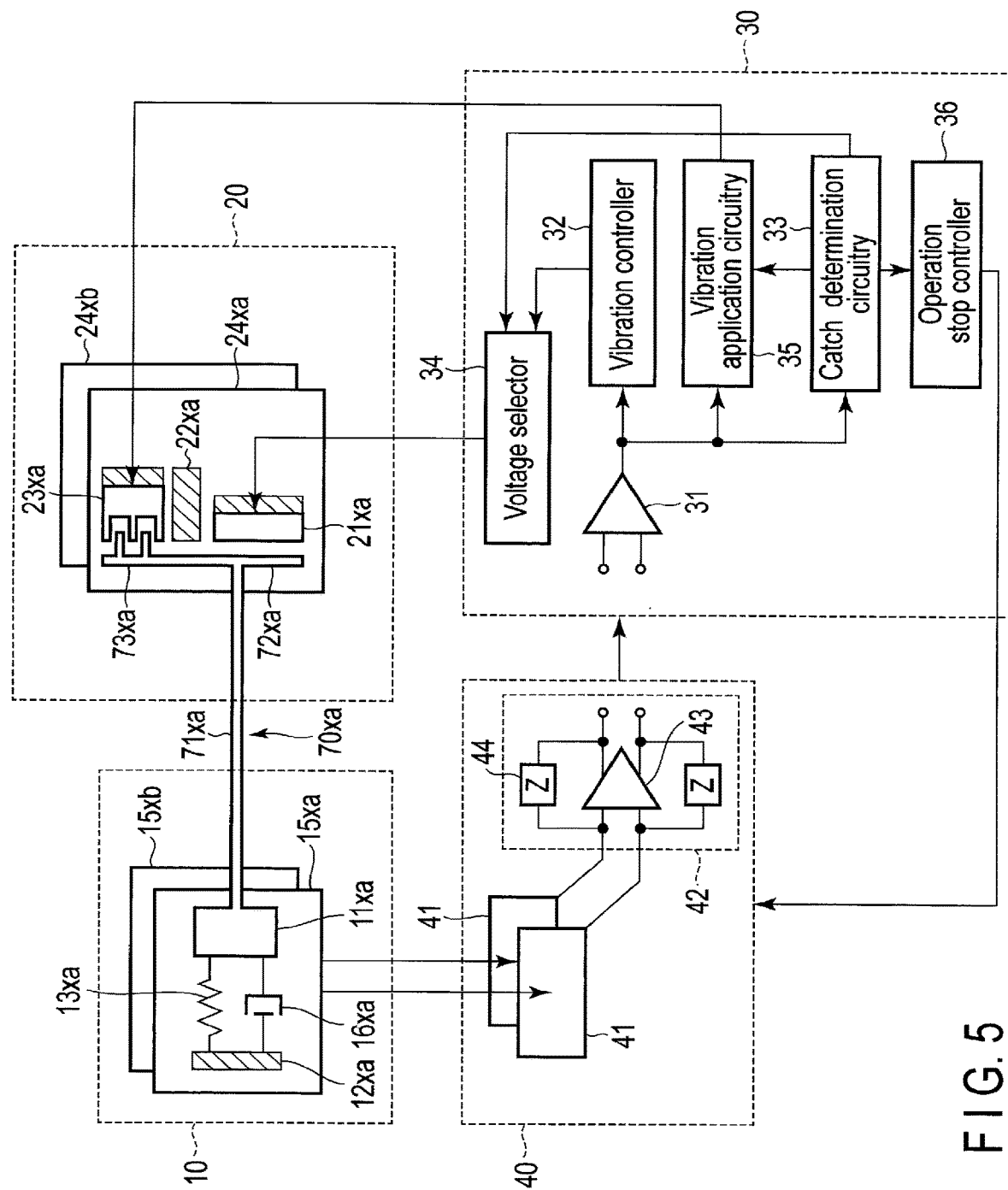
FIG. 5 is a diagram illustrating a configuration example of respective units included in the vibration apparatus according to the embodiment.

FIG. 5 is a diagram illustrating a configuration example of respective units included in the vibration apparatus according to the embodiment.

The vibration apparatus illustrated in FIG. 5 includes the coupled vibration mechanism 10, the catch and release mechanism 20, the controller 30, and the positional detector 40.

In FIG. 5, the coupled vibration mechanism 10 includes the two vibrator units 15$xa$ and 15$xb$. The vibrator unit 15$xa$ includes the mass part 11$xa$, the secured part 12$xa$, the connection spring part 13$xa$, and a damper part 16$xa$.

The mass part 11$xa$ is a part of a movable body 70$xa$. The movable body 70$xa$ includes the mass part 11$xa$, a connection part 71$xa$, a parallel plate electrode part 72$xa$, and a comb electrode part 73$xa$. One end of the connection spring part 13$xa$ is connected to the corresponding mass part 11$xa$ while the other end thereof is connected to the corresponding secured part 12$xa$. Accordingly, the connection spring part 13$xa$ expands and contracts in response to the vibration of the mass part 11$xa$.

The vibrator unit 15$xb$ is configured in a similar manner to that of the vibrator unit 15$xa$.

The catch and release mechanism 20 includes the electrode/stopper units 24$xa$ and 24$xb$. The electrode/stopper unit 24$xa$ includes the catch electrode part 21$xa$, the stopper part 22$xa$, and the vibration application electrode part 23$xa$.

The catch electrode part 21$xa$ is a parallel plate electrode. The catch electrode part 21$xa$ and the parallel plate electrode part 72$xa$ function as a parallel plate actuator and catch and release the movable body 70$xa$. The stopper part 22$xa$ prevents the movable body 70$xa$ from contacting the catch electrode part 21$xa$ and contacting the vibration application electrode part 23$xa$. The vibration application electrode part 23$xa$ is a comb electrode. The vibration application electrode part 23$xa$ is an electrode for applying the vibration, which is configured to provide the comb electrode part 73$xa$ of the movable body 70$xa$ with the electrostatic attractive force, and is controlled by a below-mentioned a vibration application circuitry 35.

The electrode/stopper unit 24$xb$ is configured in a similar manner to that of the electrode/stopper unit 24$xa$.

The positional detector 40 includes a plurality of transducer elements 41 and a displacement amount conversion circuit 42. The transducer elements 41 are provided to correspond to the respective vibrator units 15$xa$ and 15$xb$. Each of the transducer elements 41 includes a variable capacitor in which capacitance changes in accordance with vibration of the movable body 70$xa$ in the drive direction, for example. The displacement amount conversion circuit 42 includes an amplifier 43 and an impedance element 44. In the positional detector 40, a physical quantity (capacitance) which changes in accordance with the vibration of the mass part 11$xa$ in the drive direction and a physical quantity (capacitance) which changes in accordance with the vibration of the mass part 11$xb$ in the drive direction are converted into voltage values, respectively, by the transducer elements 41 and the displacement amount conversion circuit 42. Signals indicating the converted voltage values are then output from the positional detector 40 to the controller 30.

The controller 30 includes a comparator 31, a vibration controller 32 (vibration control unit), a catch determination circuitry 33 (catch determination unit), a voltage selector 34 (voltage selection unit), the vibration application circuitry 35, and an operation stop controller 36 (operation stop unit).

A signal output from the positional detector 40 is transmitted to the vibration controller 32, the catch determination circuitry 33, and the vibration application circuitry 35 via the comparator 31.

The vibration controller 32 controls selection of a voltage by the below-mentioned voltage selector 34 based on the signal output from the positional detector 40 to control a vibration state of the mass part 11$xa$. The vibration controller 32 outputs control information to the voltage selector 34. The control information includes information about a voltage to be applied between the catch electrode part 21$xa$ and the parallel plate electrode part 72$xa$, that is, a voltage to be selected by the voltage selector 34. In a case in which the catching operation is executed, the vibration controller 32 transmits the control information including information about the aforementioned holding voltage to the voltage selector 34 at timing at which the mass part 11$xa$ approaches the catch electrode part 21$xa$ most closely.

The catch determination circuitry 33 determines whether the electrode/stopper unit 24$xa$ has succeeded in or failed in catching the mass part 11$xa$ based on a signal output from the positional detector 40 (a vibration state of the mass unit 11). A success in catching the mass part 11$xa$ means that the electrode/stopper unit 24$xa$ has caught the mass part 11$xa$ while a failure in catching the mass part 11$xa$ means the electrode/stopper unit 24$xa$ has not caught the mass unit 11$xa$.

Specifically, the catch determination circuitry 33 determines whether the mass part 11$xa$ is in a the vibration state or in a vibration stop state based on the signal output from the positional detector 40 to determine whether the electrode/stopper unit 24$xa$ succeeded in or failed in catching the mass part 11$xa$. Also, the catch determination circuitry 33 outputs the result of the catch determination to the voltage selector 34, the vibration application circuitry 35, and the operation stop controller 36.

The voltage selector 34 selects the voltage to be applied between the catch electrode part 21$xa$ and the parallel plate electrode part 72$xa$ of the movable body 70$xa$. At this time, the voltage selector 34 selects the apply voltage based on the control information output from the vibration controller 32 or the result of the catch determination from the catch determination circuitry 33. At the time of the catching operation, the voltage selector 34 selects the control voltage based on the control information output from the vibration controller 32. On the other hand, at the time of the catch control in a case in which the catch determination is the failure, the voltage selector 34 performs a voltage selection for raising the possibility for catching the mass part 11$xa$ based on the result of the catch determination from the catch determination circuitry 33.

Examples of the voltage value to be selected are the holding voltage VH, the release voltage VL, the intermediate voltage VM, and an change holding voltage V0 (>VH). The holding voltage VH, the release voltage VL, and the intermediate voltage VM are as described above. The change holding voltage V0 is a voltage to be applied in a case in which the result of the catch determination from the catch determination circuitry 33 is the failure.

In a case of catching the mass part 11$xa$, the voltage selector 34 switches the voltage to be applied to the catch electrode part 21$xa$ to the holding voltage VH at the timing at which the mass part 11$xa$ approaches the catch electrode part 21$xa$ most closely. In a case of releasing the mass part 11$xa$, the voltage selector 34 switches voltage to be applied to the catch electrode part 21$xa$ to the intermediate voltage VM at timing at which the mass part 11$xa$ is released and then switches the switched voltage to the release voltage VL.

In a case in which the result of the catch determination from the catch determination circuitry 33 is the failure, at the time of the operation of catching the mass part 11$xa$, the voltage selector 34 switches the voltage to be applied to the catch electrode part 21$xa$ from the holding voltage VH to the change holding voltage V0. Thus, the possibility for catching the mass part 11xa by the electrode/stopper unit 24xa is raised.

The vibration application circuitry 35 applies the vibration to the mass unit 11 by the vibration application unit 23. More specifically, the vibration application circuitry 35 applies the vibration to the mass part 11xa in synchronization with the vibration state of the mass part 11xa based on the signal output from the positional detector 40. Thus, the amplitude of the mass part 11xa increases. Specifically, the vibration application circuitry 35 inputs a signal synchronized with the signal output from the positional detector 40 to the vibration application electrode part 23xa, that is, applies the voltage synchronized with the vibration of the mass part 11xa between the vibration application electrode part 23xa and the comb electrode part 73xa, to provide the mass part 11xa with the electrostatic attractive force. As a result, since the mass part 11xa receives the electrostatic attractive force resulting from the voltage application, the amplitude of the mass part 11xa increases. Accordingly, the possibility for catching the mass part 11xa by the electrode/stopper unit 24xa is raised.

The operation stop controller 36 stops an operation of the positional detector 40 based on the result of the catch determination from the catch determination circuitry 33. That is, the operation stop controller 36 stops the operation of the positional detector 40, if catching the mass unit 11 is determined as successful. Meanwhile, the operation stop controller 36 may stop operations of the vibration information detection unit 50 and the angular velocity calculation unit 60.

Meanwhile, vibration can be applied to the mass part 11xa with use of the catch electrode part 21xa instead of the vibration application electrode part 23xa. In this case, the voltage synchronized with vibration of the mass part 11xa is applied between the catch electrode part 21xa and the parallel plate electrode part 72xa to be superposed on the apply voltage at the time of the catching operation (holding voltage VH). In a case in which the catch electrode part 21xa is used for the vibration application operation instead of the vibration application electrode part 23xa, the vibration application electrode part 23xa may not be provided in the electrode/stopper unit 24xa.

On the other hand, since the catch electrode part 21xa is the parallel plate electrode, the distance between the catch electrode part 21xa and the parallel plate electrode part 72xa varies depending on the position of the mass part 11xa. An electrostatic attractive force resulting from the voltage to be applied between the catch electrode part 21xa and the parallel plate electrode part 72xa is smaller as the distance between the catch electrode part 21xa and the parallel plate electrode part 72xa is longer. For this reason, in a case in which the mass part 11xa move far from the catch electrode part 21xa, the electrostatic attractive force to be provided to the mass part 11xa is weakened.

Conversely, since the vibration application electrode part 23xa is a comb electrode, the distance between the vibration application electrode part 23xa and the comb electrode part 73xa in teeth arranging direction is constant. Thus, an electrostatic attractive force resulting from the voltage to be applied between the vibration application electrode part 23xa and the comb electrode part 73xa does not depend on the position of the mass part 11xa. Accordingly, by using the vibration application electrode part 23xa instead of the catch electrode part 21xa, the vibration application operation can be controlled easily.

Meanwhile, in the aforementioned example, as processing of raising the catch possibility (catch probability), both processing of increasing the apply voltage between the catch electrode part 21xa and the parallel plate electrode part 72xa and processing of applying the voltage synchronized with vibration of the mass part 11xa between the vibration application electrode part 23xa and the comb electrode part 73xa are performed. However, either one of them may be performed.

Figure 6:
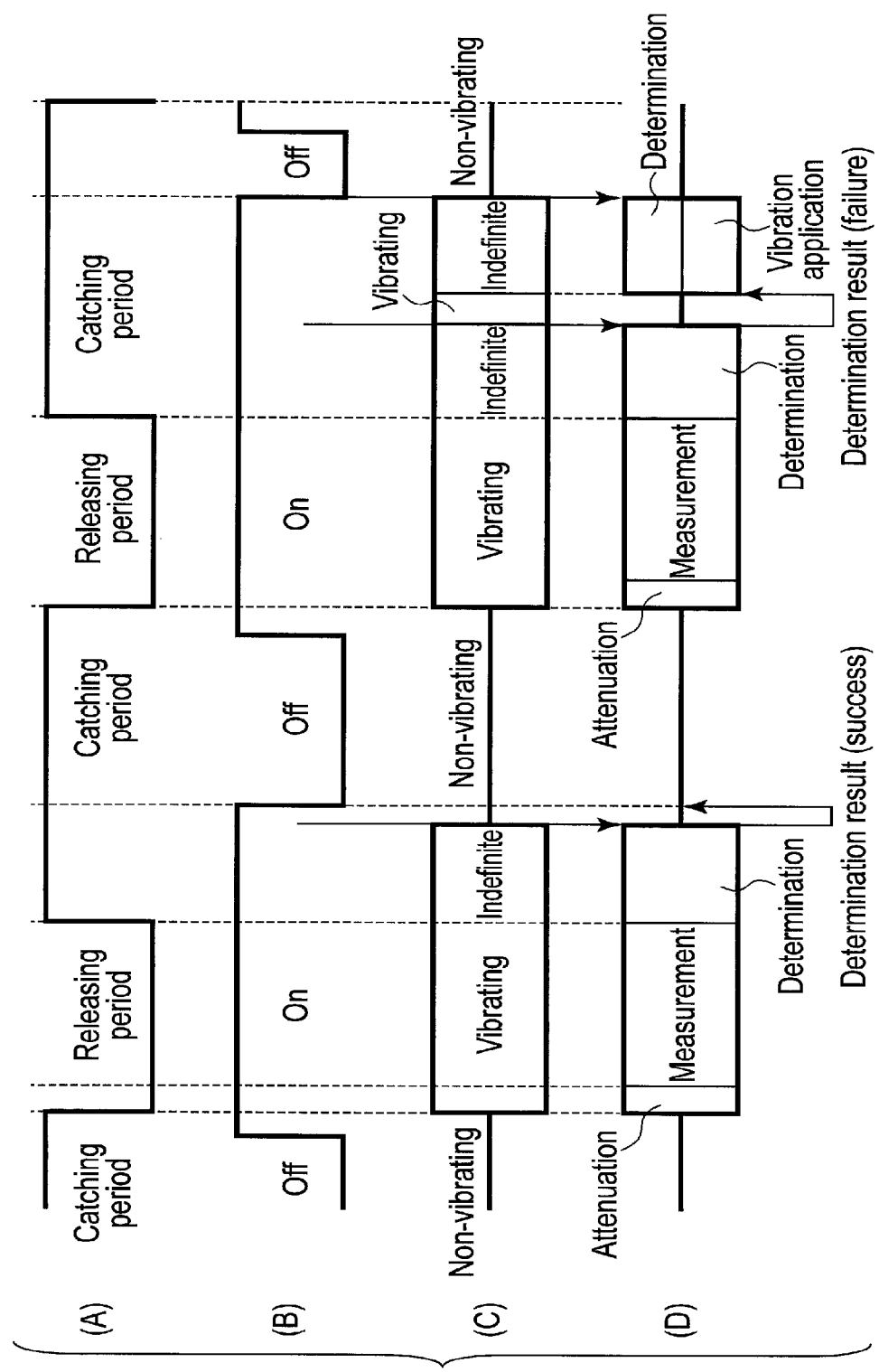
FIG. 6 is a first specific sequence diagram illustrating a releasing operation and catching operation according to the embodiment.

FIG. 6 is a first specific sequence diagram illustrating a releasing and catching operation according to the present embodiment.

Meanwhile, although FIG. 6 shows that the vibration application operation is executed to raise the catch possibility, an operation of increasing the apply voltage between the mass unit 11 and the electrode unit 21 may be executed instead of the vibration application operation, or both of the operations may be executed.

A sequence (A) illustrates a control state of the catching operation and the releasing operation by the catch and release mechanism 20. In a catching period, the controller 30 applies the holding voltage VH between the mass unit 11 and the electrode unit 21. In a releasing period, the controller 30 applies the intermediate voltage VM and then the release voltage VL between the mass unit 11 and the electrode unit 21.

A sequence (B) illustrates an operation state of the positional detector 40. The positional detector 40 is operated in an On state while the positional detector 40 stops the operation in an Off state. A sequence (C) illustrates the vibration state of the mass unit 11. As states of the mass unit, a non-vibrating state, a vibrating state, and an indefinite state are provided. In the sequences in FIG. 6, the catch determination circuitry 33 performs the catch determination based on the vibration state of the mass unit 11 in a period in which the vibration state of the mass unit 11 is the indefinite state. Thus, in the indefinite period, whether or not the mass unit 11 is vibrating is indefinite. A sequence (D) illustrates respective control states (an attenuation vibration operation state, a catch determination operation state, and a vibration application operation state) of the controller 30 and a measurement operation state of the vibration apparatus.

Next, operations of the vibration apparatus based on the sequences in FIG. 6 will be described.

In the sequence (B), the controller 30 operates the positional detector 40 immediately before the catch and release mechanism 20 releases the mass unit 11. As a result, the state of the positional detector 40 shifts from the Off state to the On state. The reason for this is to secure a startup period in which the positional detector 40 detects positional information of the mass unit 11.

In the sequence (A), when the catch and release mechanism 20 releases the mass unit 11, the mass unit 11 vibrates (shift from the non-vibrating state to the vibrating state) as illustrated in the sequence (C). At this time, as illustrated in the sequence (D), the controller 30 first performs the attenuation vibration operation. That is, the controller 30 applies the voltage VM. After the attenuation vibration operation is completed, each of the vibration information detection unit 50 and the positional detector 40 performs an operation of measuring the physical quantity. This measurement operation is an operation of measuring positional information (vibration information) of the mass unit 11 in the drive direction and in the sense direction. In the measurement operation, the vibration information detection unit 50 detects the vibration information of the mass unit 11 based on changes of capacitance of the first variable capacitor and capacitance of the second variable capacitor.

After the attenuation vibration operation and the measurement operation, the catch and release mechanism 20 performs the catching operation of the mass unit 11 as illustrated in the sequence (A). The catch and release mechanism 20 preferably succeeds in catching the mass unit 11. However, since the controller 30 is performing the attenuation vibration operation, the amplitude of the mass unit 11 decreases, and the catch condition may not be satisfied.

Under such circumstances, at the same time as the catching operation of the mass unit 11 by the catch and release mechanism 20, the controller 30 performs the catch determination as illustrated in the sequence (D). As illustrated in the sequence (C), the vibration state of the mass unit 11 is indefinite during the catch determination. That is, catch may be successful or failed. The controller 30 performs the catch determination based on the vibration state (positional information) of the mass unit 11 detected by the positional detector 40. For this reason, as illustrated in the sequence (B), the positional detector 40 is operated for a while after the start of the catching operation. Time during which the vibrator unit 15 including the mass unit 11 contacts the stopper unit 22 to cause the vibration of the vibrator unit 15 to stop completely is approximately one vibration cycle of the mass unit 11 or shorter. Thus, a catch determination period of the controller 30 is at least as long as one vibration cycle of the mass unit 11. At least during this period, the positional detector 40 is in a state of waiting for the result of the catch determination.

During the catch determination period, in a case in which an amplitude of vibration of the voltage included in the signal from the positional detector 40 is a predetermined value or less, it can be determined that the mass unit 11 stops. Thus, in this case, the controller 30 determines that the result of the catch determination is the success. On the other hand, during the catch determination period, in a case in which the voltage included in the signal from the positional detector 40 fluctuates, it can be determined that the mass unit 11 is vibrating. Thus, the controller 30 determines that the result of the catch determination is the failure.

In a case in which the result of the catch determination is the success, it is determined that the mass unit 11 is not vibrating (in the non-vibrating state) as illustrated in the sequence (C). Also, in a case in which the result of the catch determination is the success, the controller 30 stops the operation of the positional detector 40 as illustrated in the sequence (B). Accordingly, since an unnecessary operation of the positional detector 40 can be stopped, power consumption can be lowered. Meanwhile, the operations of the vibration information detection unit 50 and the angular velocity calculation unit 60 are stopped when the aforementioned measurement operation is ended (at the time of start of the catching operation).

After the mass unit 11 is caught, the positional detector 40 is activated immediately before release of the mass unit 11 in the sequence (B) as described above. Thereafter, since the catch and release mechanism 20 releases the mass unit 11 in the sequence (A), the mass unit 11 vibrates as illustrated in the sequence (C). Subsequently, after the attenuation vibration operation and the operation of measuring the physical quantity are executed as illustrated in the sequence (D), the catch and release mechanism 20 performs the operation of catching the mass unit 11 as illustrated in the sequence (A). Also, at the same time as the operation of catching the mass unit 11 by the catch and release mechanism 20, the controller 30 performs the catch determination as illustrated in the sequence (D).

In a case in which the result of the catch determination is the failure, it is determined that the mass unit 11 is in the vibrating state as illustrated in the sequence (C). In this case, as illustrated in the sequence (D), the controller 30 performs the catch determination while performing the vibration application operation. During a period during which the controller 30 is performing the vibration application operation and the catch determination, the vibration state of the mass unit 11 is the indefinite state.

As described above, the controller 30 applies the vibration to the mass unit 11 in synchronization with the vibration state of the mass unit 11. The controller 30 also performs the catch determination based on the vibration state of the mass unit 11. Also, the vibration state of the mass unit 11 is detected by the positional detector 40. Thus, as illustrated in the sequence (B), the positional detector 40 is operated at the time of the vibration application operation and at the time of the catch determination.

The controller 30 continues the vibration application operation and the catch determination until the catch and release mechanism 20 catches the mass unit 11. When the catch and release mechanism 20 succeeds in catching the mass unit 11, it is determined that the mass unit 11 is not vibrating (in a non-vibrating state) as illustrated in the sequence (C).

In this case, the controller 30 stops the operation of the positional detector 40. Meanwhile, the operations of the vibration information detection unit 50 and the angular velocity calculation unit 60 are stopped at the time of end of the measurement operation, that is, at the time of start of the catching operation.

By performing the catch determination and the operation for raising the catch possibility (catch probability) based on the sequences illustrated in FIG. 6, the catch and release mechanism 20 can catch the mass unit 11 reliably. Accordingly, it is possible to prevent the catching operation from being incomplete due to the attenuation vibration operation.

Meanwhile, in a case in which the result of the catch determination is the failure, the controller 30 may perform the catch determination after performing the vibration application operation. That is, the vibration application operation and the catch determination may not be performed at the same time. In this case, start of the vibration application operation, stop of the vibration application operation, and the catch determination are repeated in this order.

Also, in the sequences illustrated in FIG. 6, the controller 30 may start the vibration application operation at the time of start of the catching operation (at the time of start of the catch determination). In other words, the controller 30 may start the vibration application operation before the catch determination is completed.

However, this will cause an unnecessary vibration application operation to be performed during the catch determination period in a case in which the catch condition is satisfied. In this case, unnecessary power consumption will be generated. Accordingly, by performing the vibration application operation after the catch determination is completed and in a case in which the result of the catch determination is the failure, the power consumption can be lowered.

However, in a case in which it can be determined before performing the catch determination that the catch condition is not satisfied at the time of the catching operation, the controller 30 can start the vibration application operation at the time of start of the catching operation, which enables the catch and release mechanism 20 to catch the mass unit 11 early. For example, by storing experiment data about releasing and catching the mass unit 11 in the vibration apparatus, whether or not the catch condition is satisfied at the time of the catching operation after releasing the mass unit 11 can be determined based on the experiment data and the condition and the like at the time of releasing the mass unit 11.

Meanwhile, in a case in which the operation of increasing the apply voltage between the mass unit 11 and the electrode unit 21 is performed, the voltage V0, which is greater than the holding voltage VH, may be applied, and the catch determination may be performed. In a case in which the result of the catch determination is the failure, a voltage V1, which is greater than the voltage V0, may be applied. That is, each time the result of the catch determination is the failure, the voltage to be applied between the mass unit 11 and the electrode unit 21 may gradually be increased until the catch and release mechanism 20 catches the mass unit 11. Also, after the catch and release mechanism 20 has succeeded in catching the mass unit 11, the voltage to be applied between the mass unit 11 and the electrode/stopper unit 24 may be decreased from the voltage applied at the time of the success in catching to the holding voltage VH.

In the sequences illustrated in FIG. 6, during a period after the catch and release mechanism 20 has succeeded in catching the mass unit 11 and before the startup period starts, the operation of the positional detector 40 is stopped to save power of the entire vibration apparatus. However, in a case in which the result of the catch determination is the failure, the control for raising the catch possibility (catch probability) and the catch determination are performed until the catch and release mechanism 20 succeeds in catching the mass unit 11. Also, since the operation of the positional detector 40 cannot be stopped during the catch determination period, an operation period of the positional detector 40 is extended.

To prevent the operation period of the positional detector 40 from being extended, a method described below may be employed. According to the method described below, by increasing the rate of stop of the operation of the positional detector 40 with respect to a catch and release cycle, additional power saving of the positional detector 40 and power saving of the entire vibration apparatus can be achieved.

FIG. 7 is a second specific sequence diagram illustrating a releasing and catching operation according to the present embodiment. FIG. 7 illustrates improved sequences to lower the power consumption further than the sequences illustrated in FIG. 6. In the sequences illustrated in FIG. 7, the controller 30 determines whether catching the mass unit 11 by the catch and release mechanism 20 is successful or failed before releasing the mass unit 11 by the catch and release mechanism 20. And the controller 30 controls the catch and release mechanism 20 for raising possibility for catching the mass unit 11 by the catch and release mechanism 20 in a period from releasing the mass unit 11 by the catch and release mechanism 20 to subsequent catching the mass unit 11 by the catch and release mechanism 20, if catching the mass unit 11 is determined as failed. The details thereof will be described below. It is to be noted that meanings of sequences (A), (B), (C), and (D) are similar to those in FIG. 6. Also, although FIG. 7 shows that a vibration application operation is executed to raise the catch possibility, the operation of increasing the apply voltage between the mass unit 11 and the electrode unit 21 may be executed instead of the vibration application operation, or both of the operations may be executed.

In the sequences illustrated in FIG. 6, since the catch determination starts at timing of start of the catching operation, the catch determination is performed during a period from start of the catching operation to catching the mass unit 11. During the period, the positional detector 40 is operated.

In FIG. 7, as illustrated in a sequence (D), the controller 30 performs the catch determination immediately before the catch and release mechanism 20 performs the releasing operation the mass unit 11. In a case in which the mass unit 11 is caught by the catch and release mechanism 20 in the state in which the holding voltage VH is applied, the mass unit 11 is released and starts vibration by applying a smaller voltage than the holding voltage VH. On the other hand, in a case in which the mass unit 11 is not caught by the catch and release mechanism 20 in the state in which the holding voltage VH is applied, the mass unit 11 is in the vibrating state before and after the releasing operation.

Immediately before the catch and release mechanism 20 performs the releasing operation, the controller 30 operates the positional detector 40 as illustrated in a sequence (B). If the controller 30 operates the positional detector 40 immediately before the catch and release mechanism 20 performs the releasing operation, a catch determination time is approximately half of the vibration cycle of the mass unit 11 or shorter. Accordingly, the catch determination time can be shorter than in the case of FIG. 6.

In a case in which catching is successful as a result of the catch determination, the mass unit 11 vibrates (shift from the non-vibrating state to the vibrating state) as illustrated in a sequence (C) by the releasing operation of the catch and release mechanism 20 as illustrated in a sequence (A). At this time, as illustrated in the sequence (D), the controller 30 first performs the attenuation vibration operation. After the attenuation vibration operation is completed, each of the vibration information detection unit 50 and the positional detector 40 performs the measurement operation of measuring the physical quantity. At this time, the controller 30 does not perform the vibration application operation during the measurement operation regardless of the result of the catch determination performed immediately before the catch and release mechanism 20 performs the releasing operation. Based on the result of the catch determination, the controller 30 performs or does not perform the vibration application operation at the time of start of the catching operation by the catch and release mechanism 20 immediately after the measurement operation.

Sometime after the catch and release mechanism 20 performs the releasing operation, the catch and release mechanism 20 performs the catching operation as illustrated in the sequence (A). At this time, in a case in which the result of the catch determination performed immediately before the catch and release mechanism 20 performs the releasing operation is the success, the controller 30 does not perform the vibration application operation. Also, as illustrated in the sequence (B), the controller 30 stops the operation of the positional detector 40. At this time, the controller 30 stops the operations of the vibration information detection unit 50 and the angular velocity calculation unit 60. Since the catch determination is not performed, whether or not the mass unit 11 is vibrating is indefinite as illustrated in the sequence (C). As illustrated in the sequence (D), the controller 30 performs the catch determination immediately before the catch and release mechanism 20 performs the releasing operation.

During the catch determination period, the controller 30 is operating the positional detector 40 as illustrated in the sequence (B).

After the releasing operation is performed by the catch and release mechanism 20 as illustrated in the sequence (A), the mass unit 11 is in the state of vibrating as illustrated in the sequence (C).

In a case in which catching is failed as a result of the catch determination, this means that the mass unit 11 has not been caught by the catch and release mechanism 20. That is, in a case in which catching is failed, this means that the mass unit 11 is vibrating in the indefinite period illustrated at the center of the sequence (C) and that the mass unit 11 is in the state of vibrating before and after the releasing operation by the catch and release mechanism 20.

Also, after the releasing operation is performed by the catch and release mechanism 20, the attenuation vibration operation and the operation of measuring the physical quantity are performed as illustrated in the sequence (D). Sometime after that, the catch and release mechanism 20 performs the catching operation as illustrated in the sequence (A).

In a case in which the result of the catch determination performed immediately before the catch and release mechanism 20 performs the releasing operation is the failure, the controller 30 performs the vibration application operation after the catch and release mechanism 20 performs the releasing operation and when the catch and release mechanism 20 subsequently performs the operation of catching the mass unit 11 as illustrated in the sequence (D). The vibration application operation is performed for as long time as the catch and release mechanism 20 can catch the mass unit 11. The vibration application period (vibration application time) is predetermined.

During the vibration application operation, the controller 30 does not perform the catch determination. Thus, whether or not the catch and release mechanism 20 has caught the mass unit 11 is indefinite, and whether or not the mass unit 11 is vibrating is indefinite as illustrated in the sequence (C). The catch determination is performed immediately before the subsequent releasing operation by the catch and release mechanism 20. In this manner, since the catch determination is not performed until the time immediately before the releasing operation, the controller 30 can stop the operation of the positional detector 40 when the vibration application operation is completed as illustrated in the sequence (B).

As described above, it is possible to determine whether or not the vibration application operation is to be performed at the time of the subsequent catching operation based on the result of the catch determination performed immediately before the releasing operation by the catch and release mechanism 20. Such control is effective especially in a case in which, in the catch and release cycle of the mass unit 11, a Q factor of vibration of the mass unit 11 is so high as to keep the amplitude.

Meanwhile, in the sequences illustrated in FIG. 7, when the result of the catch determination is the failure, the controller 30 may not perform the attenuation vibration operation, and each of the vibration information detection unit 50 and the positional detector 40 may perform the operation of measuring the physical quantity. The reason for this is that, in a case in which the mass unit 11 is not caught, the mass unit 11 is less likely to contact the stopper unit 22 due to subsequent vibration.

Also, in the sequences illustrated in FIG. 7, in a case in which not the vibration application operation but the operation of increasing the apply voltage between the mass unit 11 and the electrode unit 21 is performed when the result of the catch determination is the failure, the controller 30 can immediately stop the operation of the positional detector 40 when the catching operation is started. The reason for this is the following. In a case in which the vibration application operation is performed, the controller 30 operates the positional detector 40 to apply the voltage synchronized with the vibration cycle of the mass unit 11 to the vibration application unit 23. However, in a case in which the operation of increasing the apply voltage between the mass unit 11 and the electrode unit 21 is performed, such synchronization is not required.

Meanwhile, in a case in which the operation of increasing the apply voltage between the mass unit 11 and the electrode unit 21 is performed, the voltage V0 (>VH) enabling the catch and release mechanism 20 to catch the mass unit 11 may be predetermined, and the controller 30 may apply the predetermined voltage at the time of the catching operation after it is found that the result of the catch determination is the failure. Also, the catch determination may be performed after the controller 30 applies the voltage V0, and in a case in which the result of the catch determination is the failure, the controller 30 may apply the voltage V1, which is greater than the voltage V0, at the time of the catching operation after the catch determination. That is, until catching becomes successful, the controller 30 may increase the voltage to be applied at the time of the catching operation each time the catching operation is performed.

In the sequences illustrated in FIG. 7, since the catch determination is performed immediately before the catch and release mechanism 20 performs the releasing operation, the catch determination time can be short. Also, in a case in which the result of the catch determination is the failure, the control operation of raising the catch possibility is postponed until the subsequent catching operation. Accordingly, time to stop the operation of the positional detector 40 during the catch determination time (catch determination period) can be increased, and power saving of the positional detector 40 can be achieved.

Figure 8:
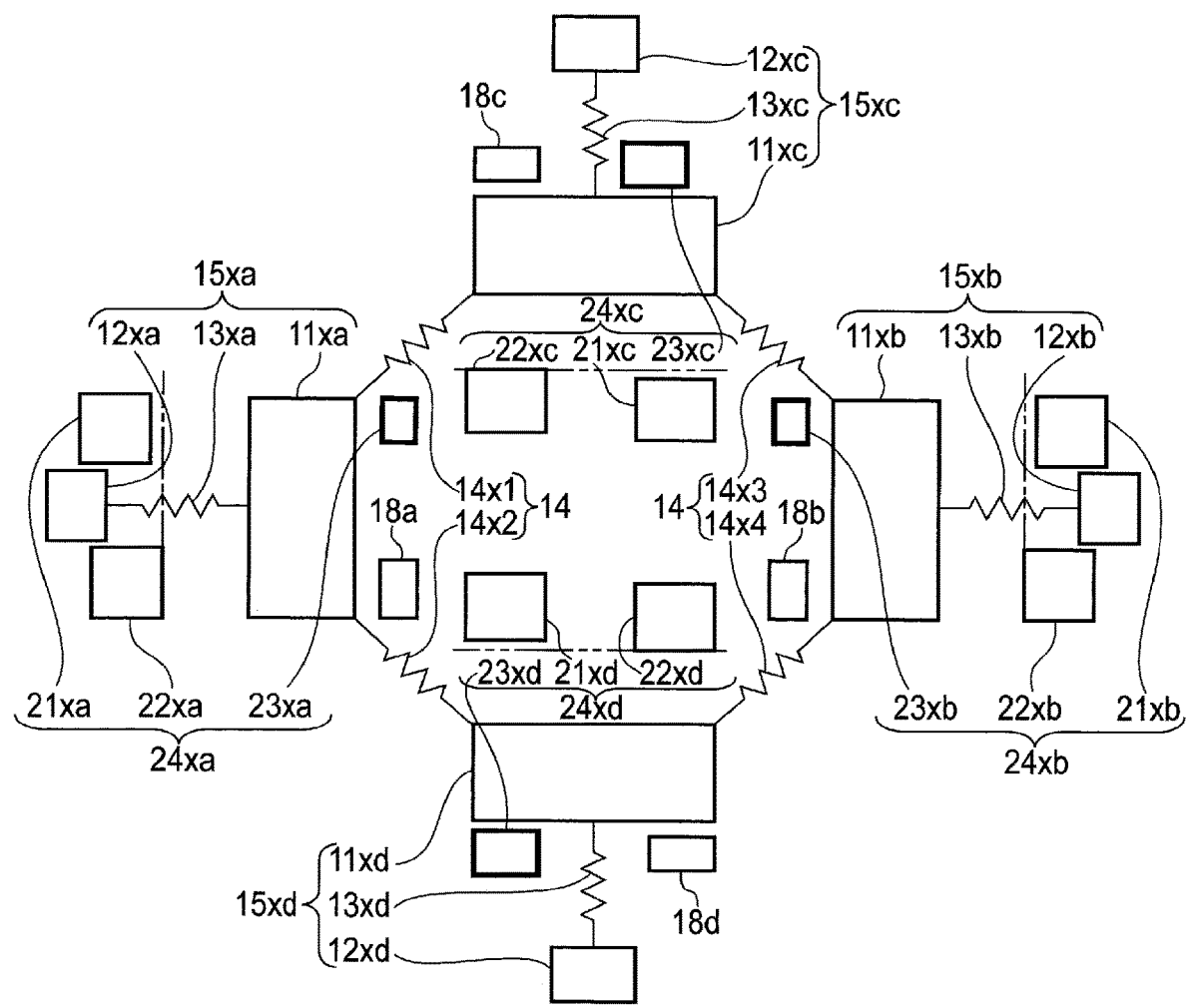
FIG. 8 is a diagram schematically illustrating a second specific configuration example of the vibration apparatus according to the embodiment.

FIG. 8 is a diagram schematically illustrating a second specific configuration example of the vibration apparatus according to the embodiment. The basic concept is similar to that of the vibration apparatus illustrated in FIG. 1. Also, since the basic configuration is similar to that of the first specific configuration example illustrated in FIG. 2 and FIG. 3, description of matters described in the first specific configuration example is omitted.

In the vibration apparatus illustrated in FIG. 8, the coupled vibration mechanism includes four vibrator units 15xa, 15xb, 15xc, and 15xd, and the catch and release mechanism includes four electrode/stopper units 24xa, 24xb, 24xc, and 24xd.

The vibrator unit 15xa includes the mass part 11xa, the secured part 12xa, and the connection spring part 13xa. The vibrator unit 15xb includes the mass part 11xb, the secured part 12xb, and the connection spring part 13xb. The vibrator unit 15xc includes a mass part 11xc, a secured part 12xc, and a connection spring part 13xc. The vibrator unit 15xd includes a mass part 11xd, a secured part 12xd, and a connection spring part 13xd.

The electrode/stopper unit 24xa includes the catch electrode part 21xa, the stopper part 22xa, and the vibration application electrode part 23xa. The electrode/stopper unit 24xb includes the catch electrode part 21xb, the stopper part 22xb, and the vibration application electrode part 23xb. The electrode/stopper unit 24xc includes a catch electrode part 21xc, a stopper part 22xc, and a vibration application electrode part 23xc. The electrode/stopper unit 24xd includes a catch electrode part 21xd, a stopper part 22xd, and a vibration application electrode part 23xd.

The mass part (first mass part) 11xa and the mass part (second mass part) 11xb are arranged in the direction parallel to the vibration direction (first direction) thereof. The mass part (third mass part) 11xc and the mass part (fourth mass part) 11xd are arranged in a direction parallel to a vibration direction (second direction) thereof. The second direction is perpendicular to the first direction.

The mass part 11xa, the mass part 11xb, the mass part 11xc, and the mass part 11xd are connected via the connection unit 14. Specifically, the connection unit 14 includes a connection member 14x1 connecting the mass part 11xa to the mass part 11xc, a connection member 14x2 connecting the mass part 11xa to the mass part 11xd, a connection member 14x3 connecting the mass part 11xb to the mass part 11xc, and a connection member 14x4 connecting the mass part 11xb to the mass part 11xd.

The electrode part 18a is provided near the mass part 11xa, and the mass part 11xa and the electrode part 18a constitute the first variable capacitor. The electrode part 18b is provided near the mass part 11xb, and the mass part 11xb and the electrode part 18b constitute the second variable capacitor. An electrode part 18c is provided near the mass part 11xc, and the mass part 11xc and the electrode part 18c constitute a third variable capacitor. An electrode part 18d is provided near the mass part 11xd, and the mass part 11xd and the electrode part 18d constitute a fourth variable capacitor.

Similarly to the first specific configuration example illustrated in FIG. 2 and FIG. 3, as distances between the mass parts 11xa, 11xb, 11xc, and 11xd and the corresponding electrode parts 18a, 18b, 18c, and 18d vary, capacitances of the first, second, third, and fourth variable capacitors vary, respectively. Based on the capacitance varies, the vibration information is detected by the vibration information detection unit 50 in FIG. 1.

The mass part 11xa and the mass part 11xb vibrate in anti-phase. That is, when the mass part 11xa moves far from the secured part 12xa, the mass part 11xb also moves far from the secured part 12xb. Conversely, when the mass part 11xa approaches the secured part 12xa, the mass part 11xb also approaches the secured part 12xb. Similarly, the mass part 11xc and the mass part 11xd vibrate in anti-phase. In this manner, since the mass part 11xa and the mass part 11xb vibrate in anti-phase, and the mass part 11xc and the mass part 11xd vibrate in anti-phase, the influence of translational movement such as acceleration can be eliminated, and the rotational movement can be extracted appropriately.

Also, a pair of the mass parts 11xa and 11xb and a pair of the mass parts 11xc and 11xd vibrate in anti-phase. That is, when the mass part 11xa and the mass part 11xb approach each other, the mass part 11xc and the mass part 11xd move far from each other. When the mass part 11xa and the mass part 11xb move far from each other, the mass part 11xc and the mass part 11xd approach each other.

The basic principle and the basic operation when the electrode/stopper units 24xa, 24xb, 24xc, and 24xd catch the mass parts 11xa, 11xb, 11xc, and 11xd, respectively, are similar to those in the first specific configuration example illustrated in FIG. 2 and FIG. 3. In the present configuration example, since the pair of the mass parts 11xa and 11xb and the pair of the mass parts 11xc and 11xd vibrate in anti-phase, at the timing at which the mass parts 11xa and 11xb are caught by the electrode/stopper units 24xa and 24xb, the mass parts 11xc and 11xd are caught by the electrode/stopper units 24xc and 24xd, respectively.

The basic principle and the basic operation when the mass parts 11xa, 11xb, 11xc, and 11xd are released from the electrode/stopper units 24xa, 24xb, 24xc, and 24xd, respectively, are similar to those in the first specific configuration example illustrated in FIG. 2, FIG. 3, and FIG. 4. That is, in the present configuration example as well as in FIG. 4 illustrating the first specific configuration example, the period for applying the intermediate voltage VM is provided between the period for applying the holding voltage VH and the period for applying the release voltage VL. Thus, in the present configuration example as well as in the first specific configuration example, the amplitude caused by the beat can also be lowered. The mass parts 11xa, 11xb, 11xc, and 11xd can be prevented from contacting the stopper parts 22xa, 22xb, 22xc, and 22xd during the vibration, and the detection operations are able to be performed with accuracy.

The basic principle and the basic operation when vibrations are applied to the mass parts 11xa, 11xb, 11xc, and 11xd by the vibration application electrode parts 23xa, 23xb, 23xc, and 23xd, respectively, are similar to those in the first specific configuration example illustrated in FIG. 2 and FIG. 3. Also, the basic principle and the basic operation for increasing the voltage to be applied to the catch electrode parts 21xa, 21xb, 21xc, and 21xd when the electrode/stopper units 24xa, 24xb, 24xc, and 24xd catch the mass parts 11xa, 11xb, 11xc, and 11xd, respectively, are similar to those in the first specific configuration example illustrated in FIG. 2 and FIG. 3. That is, in the present configuration example as well as in FIG. 5 illustrating the first specific configuration example, the controller 30 determines whether respective operations of catching the mass parts 11xa, 11xb, 11xc, and 11xd by the electrode/stopper units 24xa, 24xb, 24xc, and 24xd are successful or failed. In a case in which the result of the determination is the failure, the controller 30 performs catch control for raising possibility for catching the mass parts 11xa, 11xb, 11xc, and 11xd (catch probability). As described above, the catch control for raising the catch possibility (catch probability) includes applying vibrations to the mass parts 11xa, 11xb, 11xc, and 11xd and increasing the voltage to be applied between the mass part 11xa and the catch electrode part 21xa, the voltage to be applied between the mass part 11xb and the catch electrode part 21xb, a voltage to be applied between the mass part 11xc and the catch electrode part 21xc, and a voltage to be applied between the mass part 11xd and the catch electrode part 21xd. Further, in terms of timing of the catch determination and the control for raising the catch possibility (probability), the sequences illustrated in FIG. 6 can be applied.

Accordingly, in the present configuration example as well as in the first specific configuration example, the electrode/stopper units 24xa, 24xb, 24xc, and 24xd can reliably catch the mass parts 11xa, 11xb, 11xc, and 11xd, respectively. Consequently, it is possible to prevent the catching operation from being incomplete due to the attenuation vibration operation.

Also, the sequences illustrated in FIG. 7 can be applied to the present configuration example. Thus, in the present configuration example as well, since the catch determination is performed immediately before the catch and release mechanism 20 performs the releasing operation, the catch determination time can be short. Also, in a case in which the result of the catch determination is the failure, the control operation of raising the catch possibility is postponed until the subsequent catching operation. Accordingly, time to stop the operation of the positional detector 40 during the catch determination time (catch determination period) can be increased, and the additional power saving of the positional detector 40 can be achieved.

Figure 9:
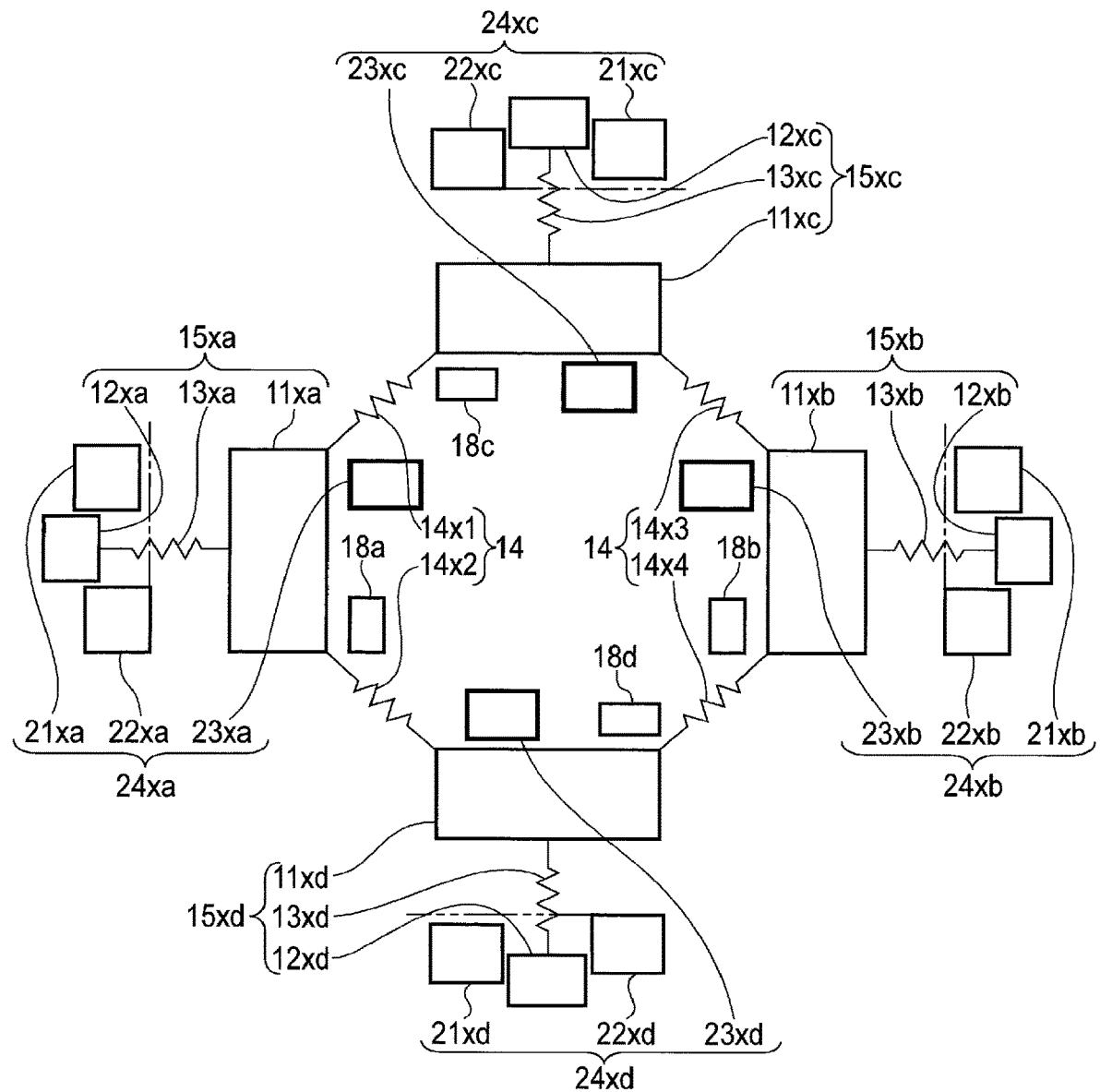
FIG. 9 is a diagram schematically illustrating a third specific configuration example of the vibration apparatus according to the embodiment.

FIG. 9 is a diagram schematically illustrating a third specific configuration example of the vibration apparatus according to the embodiment. The basic concept is similar to that of the vibration apparatus illustrated in FIG. 1. Also, the basic configuration is similar to that of the first specific configuration example illustrated in FIG. 2 and FIG. 3 and that of the second specific configuration example illustrated in FIG. 8. Thus, description of matters described in the first specific configuration example and the second specific configuration example is omitted.

In the present configuration example as well as in the second specific configuration example illustrated in FIG. 8, the mass part 11$xa$ and the mass part 11$xb$ vibrate in anti-phase, and the mass part 11$xc$ and the mass part 11$xd$ vibrate in anti-phase. However, in the present configuration example, the pair of the mass parts 11$xa$ and 11$xb$ and the pair of the mass parts 11$xc$ and 11$xd$ vibrate in in-phase. That is, when the mass part 11$xa$ and the mass part 11$xb$ approach each other, the mass part 11$xc$ and the mass part 11$xd$ approach each other. When the mass part 11$xa$ and the mass part 11$xb$ move far from each other, the mass part 11$xc$ and the mass part 11$xd$ also move far from each other.

The basic principle and the basic operation when the electrode/stopper units 24$xa$, 24$xb$, 24$xc$, and 24$xd$ catch the mass parts 11$xa$, 11$xb$, 11$xc$, and 11$xd$, respectively, are similar to those in the first specific configuration example illustrated in FIG. 2 and FIG. 3. In the present configuration example, since the pair of the mass parts 11$xa$ and 11$xb$ and the pair of the mass parts 11$xc$ and 11$xd$ vibrate in in-phase, at the timing at which the mass parts 11$xa$ and 11$xb$ are caught by the electrode/stopper units 24$xa$ and 24$xb$, the mass parts 11$xc$ and 11$xd$ are caught by the electrode/stopper units 24$xc$ and 24$xd$, respectively.

The basic principle and the basic operation when the mass parts 11$xa$, 11$xb$, 11$xc$, and 11$xd$ are released from the electrode/stopper units 24$xa$, 24$xb$, 24$xc$, and 24$xd$ catch, respectively, are similar to those in the first specific configuration example illustrated in FIG. 2, FIG. 3, and FIG. 4. That is, in the present configuration example as well as in the first specific configuration example illustrated in FIG. 4, the period for applying the intermediate voltage VM is provided between the period for applying the holding voltage VH and the period for applying the release voltage VL. Thus, in the present configuration example as well as in the first specific configuration example, the amplitude caused by the beat can also be lowered. The mass parts 11$xa$, 11$xb$, 11$xc$, and 11$xd$ can be prevented from contacting the stopper parts 22$xa$, 22$xb$, 22$xc$, and 22$xd$ during the vibration, respectively, and the detection operations are able to be performed with accuracy.

The basic principle and the basic operation when the vibrations is applied to the mass parts 11$xa$, 11$xb$, 11$xc$, and 11$xd$ by the vibration application electrode parts 23$xa$, 23$xb$, 23$xc$, and 23$xd$ are similar to those in the first specific configuration example illustrated in FIG. 2 and FIG. 3. Also, the basic principle and the basic operation for increasing the voltages to be applied to the catch electrode parts 21$xa$, 21$xb$, 21$xc$, and 21$xd$ when the electrode/stopper units 24$xa$, 24$xb$, 24$xc$, and 24$xd$ catch the mass parts 11$xa$, 11$xb$, 11$xc$, and 11$xd$, respectively, are similar to those in the first specific configuration example illustrated in FIG. 2 and FIG. 3. That is, in the present configuration example as well as in the first specific configuration example illustrated in FIG. 5, the controller 30 determines whether respective operations of catching the mass parts 11$xa$, 11$xb$, 11$xc$, and 11$xd$ by the electrode/stopper units 24$xa$, 24$xb$, 24$xc$, and 24$xd$ are successful or failed. In a case in which the result of the determination is the failure, the controller 30 performs the catch control for raising the possibility for catching the mass parts 11$xa$, 11$xb$, 11$xc$, and 11$xd$ (catch probability). As described above, the catch control for raising the catch possibility (catch probability) includes applying vibrations to the mass parts 11$xa$, 11$xb$, 11$xc$, and 11$xd$ and increasing the voltage to be applied between the mass part 11$xa$ and the catch electrode part 21$xa$, the voltage to be applied between the mass part 11$xb$ and the catch electrode part 21$xb$, the voltage to be applied between the mass part 11$xc$ and the catch electrode part 21$xc$, and the voltage to be applied between the mass part 11$xd$ and the catch electrode part 21$xd$. Further, in terms of the timing of the catch determination and the control for raising the catch possibility (probability), the sequences illustrated in FIG. 6 can be applied.

Accordingly, in the present configuration example as well as in the first specific configuration example, the electrode/stopper units 24$xa$, 24$xb$, 24$xc$, and 24$xd$ can reliably catch the mass parts 11$xa$, 11$xb$, 11$xc$, and 11$xd$, respectively. Consequently, it is possible to prevent the catching operation from being incomplete due to the attenuation vibration operation.

Also, the sequences illustrated in FIG. 7 can be applied to the present configuration example. Thus, in the present configuration example as well, since the catch determination is performed immediately before the catch and release mechanism 20 performs the releasing operation, the catch determination time can be short. Also, in a case in which the result of the catch determination is the failure, the control operation of raising the catch possibility is postponed until the subsequent catching operation. Accordingly, time to stop the operation of the positional detector 40 during the catch determination time (catch determination period) can be increased, and the additional power saving of the positional detector 40 can be achieved.

Meanwhile, in the above embodiment, although a case of performing the attenuation vibration operation has been described, the attenuation vibration operation does not need to be performed. That is, to an vibration apparatus which does not perform the attenuation vibration operation can be applied the catch control in which the catch determination is performed, and in which, in a case in which the result of the catch determination is the failure, the possibility for catching the mass unit 11 by the catch and release mechanism 20 (catch probability) is raised.

As described above, according to the present embodiment, in the vibration apparatus including the coupled vibration mechanism, the catch determination in which whether catching the mass unit by the catch and release mechanism is successful or failed is performed, and in a case in which the result of the catch determination is the failure, the catch control in which the possibility for catching the mass unit by the catch and release mechanism (catch probability) is raised is performed, which enables the catch and release mechanism to catch the mass unit. Thus, after releasing the mass unit, even in a case in which the amplitude of the mass unit decreases due to execution of the attenuation vibration operation or another reason, the mass unit can be caught. Hence, the vibration apparatus enabling an appropriate catching and releasing operation to be performed can be obtained. Accordingly, the detection operations are able to be performed with accuracy by applying such the vibration apparatus to a gyro sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A vibration apparatus comprising:
    a coupled vibration mechanism which comprises a plurality of mass parts and a connection unit configured to connect the mass parts;
    a catch and release mechanism which catches a vibrating mass parts to stop vibration and releases a caught mass parts to start vibration and comprises a vibration source including a plurality of vibration application electrode parts for applying vibration to the mass parts; and
    a control circuitry configured to:
        determine whether catching the mass parts by the catch and release mechanism is successful or failed; and
        control the catch and release mechanism for raising possibility for catching the mass parts by the catch and release mechanism, if the catching the mass parts is determined as failed,
    wherein the control circuitry is configured to apply a voltage between the vibration application electrode parts and the mass parts to apply the vibration to the mass parts to raise the possibility for catching the mass parts by the catch and release mechanism, and
    wherein the voltage is synchronized with vibration of the mass parts.

2. The vibration apparatus according to claim 1,
    wherein the catch and release mechanism further comprises an electrode to which a voltage for catching the mass parts is applied, and
    wherein the control circuitry is configured to control catching or releasing the mass part of the catch and release mechanism by applying a voltage between the mass parts and the electrode.

3. The vibration apparatus according to claim 2, wherein the control circuitry is further configured to apply, between the mass parts and the electrode, a voltage greater than a voltage which has been applied between the mass parts and the electrode to raise possibility for catching the mass parts by the catch and release mechanism, if catching the mass parts is determined as failed.

4. The vibration apparatus according to claim 2, wherein the control circuitry is further configured to apply, between the mass parts and the electrode, a voltage greater than a steady voltage applied between the mass parts and the electrode at least a part of a period from time when the mass parts are released from the catch and release mechanism to time when the steady voltage is applied between the mass parts and the electrode while the mass parts are vibrating.

5. The vibration apparatus according to claim 1, wherein there exists a first period for catching the mass parts by the catch and release mechanism, subsequently to the first period, there exists a second period for releasing the mass parts by the catch and release mechanism, and subsequently to the second period, there exists a third period for catching the mass parts by the catch and release mechanism, and
    wherein the control circuitry is configured to:
        determine whether catching the mass parts by the catch and release mechanism is actually successful or failed prior to an end of catching operation by the catch and release mechanism in the first period; and
        control the catch and release mechanism for raising the possibility for catching the mass parts by the catch and release mechanism in the third period, if catching the mass parts is determined as failed in the first period.

6. The vibration apparatus according to claim 1, wherein the control circuitry is configured to determine whether catching the mass parts by the catch and release mechanism is successful or failed based on vibration states of the mass parts.

7. The vibration apparatus according to claim 1, further comprising
    a positional detector which detects vibration states of the mass parts,
    wherein, the control circuitry stops an operation of the positional detector, if catching the mass parts is determined as successful.

8. The vibration apparatus according to claim 1, wherein the mass parts comprise a first mass part and a second mass part arranged in a first direction, and a third mass part and a fourth mass part arranged in a second direction perpendicular to the first direction.

9. The vibration apparatus according to claim 8, wherein the first mass part and the second mass part vibrate in anti-phase, and the third mass part and the fourth mass part vibrate in anti-phase.

10. The vibration apparatus according to claim 9,
    wherein when the first mass part and the second mass part approach each other, the third mass part and the fourth mass part move far from each other, and
    wherein when the first mass part and the second mass part move far from each other, the third mass part and the fourth mass part approach each other.

11. The vibration apparatus according to claim 9,
    wherein when the first mass part and the second mass part approach each other, the third mass part and the fourth mass part approach each other, and
    wherein when the first mass part and the second mass part move far from each other, the third mass part and the fourth mass part move far from each other.

* * * * *